United States Patent
Maturana et al.

(10) Patent No.: US 11,783,725 B2
(45) Date of Patent: *Oct. 10, 2023

(54) SNAPSHOT MANAGEMENT ARCHITECTURE FOR PROCESS CONTROL OPERATOR TRAINING SYSTEM LIFECYCLE

(71) Applicant: Rockwell Automation Technologies, Inc., Mayfield Heights, OH (US)

(72) Inventors: Francisco P. Maturana, Lyndhurst, OH (US); Bryan N. Siafakas, Cleveland, OH (US); Andrew R. Stump, Mentor, OH (US); Ryan Cahalane, Chagrin Falls, OH (US); Alexander B. Cherpakov, Mayfield Heights, OH (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/646,891

(22) Filed: Jan. 4, 2022

(65) Prior Publication Data

US 2022/0130275 A1    Apr. 28, 2022

Related U.S. Application Data

(63) Continuation of application No. 14/987,144, filed on Jan. 4, 2016, now Pat. No. 11,222,551.

(60) Provisional application No. 62/196,230, filed on Jul. 23, 2015.

(51) Int. Cl.
| | |
|---|---|
| G09B 19/00 | (2006.01) |
| G05B 17/02 | (2006.01) |
| G06F 30/20 | (2020.01) |
| G06N 5/04 | (2023.01) |

(52) U.S. Cl.
CPC ......... *G09B 19/0053* (2013.01); *G05B 17/02* (2013.01); *G06F 30/20* (2020.01); *G06N 5/04* (2013.01)

(58) Field of Classification Search
CPC .. G09B 19/0053; G05B 17/02; G06F 17/5009
USPC ....................................................... 434/219
See application file for complete search history.

(56) References Cited

U.S. PATENT DOCUMENTS

| | | | | |
|---|---|---|---|---|
| 9,989,958 | B2 * | 6/2018 | Asenjo | G06F 3/048 |
| 10,216,183 | B2 * | 2/2019 | Li | H04W 4/80 |
| 10,395,554 | B2 * | 8/2019 | Downs | G09B 5/00 |
| 10,496,061 | B2 * | 12/2019 | Strohmenger | G05B 19/4155 |
| 11,222,551 | B2 * | 1/2022 | Maturana | G06F 30/20 |
| 2008/0046227 | A1 * | 2/2008 | Flamingo | G05B 17/02 |
| | | | | 703/28 |

(Continued)

*Primary Examiner* — Xuan M Thai
*Assistant Examiner* — Sadaruz Zaman

(57) ABSTRACT

A cloud-based operator training system includes a snapshot management architecture, which provides a hybrid system for generation of control system level scenarios and system-state snapshots, and which can improve the fidelity of a training simulation. By implementing the simulation system on a cloud platform, the system can generate a large and growing set of snapshot files representing various control states and corresponding process states. These files can then be leverage during operator training sessions to yield high fidelity simulated system operation.

20 Claims, 16 Drawing Sheets

(56) References Cited

U.S. PATENT DOCUMENTS

| | | | |
|---|---|---|---|
| 2008/0077370 A1* | 3/2008 | Frick | G09B 5/00 |
| | | | 703/6 |
| 2009/0292514 A1* | 11/2009 | McKim | G06F 30/20 |
| | | | 703/6 |
| 2012/0078432 A1* | 3/2012 | Weatherhead | G06Q 10/06 |
| | | | 700/295 |
| 2012/0083919 A1* | 4/2012 | Maturana | G05B 23/0251 |
| | | | 700/211 |
| 2013/0073062 A1* | 3/2013 | Smith | G06Q 50/06 |
| | | | 700/33 |
| 2013/0179450 A1* | 7/2013 | Chitiveli | G06F 16/27 |
| | | | 707/737 |
| 2014/0336786 A1* | 11/2014 | Asenjo | G06F 3/048 |
| | | | 700/17 |
| 2015/0134317 A1* | 5/2015 | Maturana | G06F 30/20 |
| | | | 703/13 |
| 2022/0012603 A1* | 1/2022 | Krishnamoorthy | G06N 7/01 |
| 2023/0040231 A1* | 2/2023 | Burgess | G06N 5/04 |

* cited by examiner

SNAPSHOT MANAGEMENT ARCHITECTURE FOR PROCESS CONTROL OPERATOR TRAINING SYSTEM LIFECYCLE

CROSS-REFERENCE TO RELATED APPLICATIONS

This application claims priority to U.S. Utility application Ser. No. 14/987,144, filed on Jan. 4, 2016, and entitled "SNAPSHOT MANAGEMENT ARCHITECTURE FOR PROCESS CONTROL OPERATOR TRAINING SYSTEM LIFECYCLE", which claimed priority to U.S. Provisional Application Ser. No. 62/196,230, filed on Jul. 23, 2015, and entitled "SNAPSHOT MANAGEMENT ARCHITECTURE FOR PROCESS CONTROL OPERATOR TRAINING SYSTEM LIFECYCLE," and to the entirety of both which are incorporated herein by reference.

BACKGROUND

The subject matter disclosed herein relates generally to industrial simulations, and, for example, to a cloud-based operator training system

BRIEF DESCRIPTION

The following presents a simplified summary in order to provide a basic understanding of some aspects described herein. This summary is not an extensive overview nor is it intended to identify key/critical elements or to delineate the scope of the various aspects described herein. Its sole purpose is to present some concepts in a simplified form as a prelude to the more detailed description that is presented later.

In one or more embodiments, a system is provided, comprising an emulation component configured to execute a virtualized industrial controller on a cloud platform; a simulation component configured to execute a simulation of an industrial system on the cloud platform; an emulation data exchange component configured to execute an emulation data exchange interface that communicatively connects the virtualized controller and the simulation; and a snapshot management component configured to capture process state data representing a process state of the simulation and control state data representing a control state of the virtualized industrial controller in response to a determination that a defined condition of the simulation has been satisfied, and to generate a snapshot file based on the process state data and the control state data that records the process state and the control state.

Also, one or more embodiments provide a method for industrial operator training, comprising executing, by one or more cloud platform devices comprising at least one processor, a virtualized industrial controller; executing, by the one or more cloud platform devices, a simulation of an industrial system; executing, by the one or more cloud platform devices, an emulation data exchange interface that communicatively connects the virtualized controller and the simulation; determining, by the one or more cloud platform devices, that a defined condition of the simulation has been satisfied; recording, by the one or more cloud platform devices in response to the determining, process state data representing a process state of the simulation and control state data representing a control state of the virtualized industrial controller; and storing, by the one or more cloud platform devices, a snapshot file based on the process state data and the control state data that records the process state and the control state.

Also, according to one or more embodiments, a non-transitory computer-readable medium is provided having stored thereon executable instructions that, in response to execution, cause a system to perform operations, the operations comprising executing a virtualized industrial controller on a cloud platform; executing a simulation of an industrial system on the cloud platform; executing an emulation data exchange interface on the cloud platform, the emulation data exchange interface facilitating data exchange between the virtualized controller and the simulation; detecting that a defined condition of the simulation has been satisfied; recording, in response to the detecting, process state data representing a process state of the simulation and control state data representing a control state of the virtualized industrial controller; and storing a snapshot file comprising the process state data and the control state data, the snapshot file recording the process state and the control state.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings

DETAILED DESCRIPTION

Figure 1:
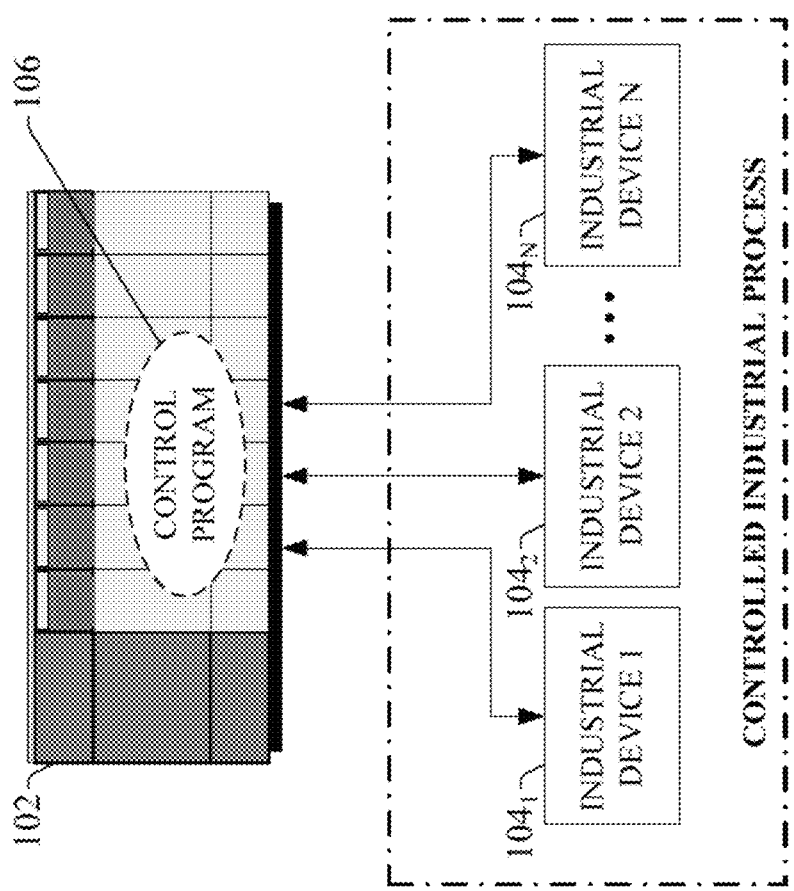
FIG. 1 is a simplified diagram illustrating an example automated industrial process controlled by an industrial controller.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial controllers and their associated I/O devices are central to the operation of modern automation systems. FIG. 1 is a simplified diagram illustrating an example automated industrial process controlled by an industrial controller 102. Industrial controller 102 interacts with industrial devices 104 on the plant floor to control one or more automated processes relating to such objectives as product manufacture, material handling, batch processing, supervisory control, and other such applications. Industrial controller 102 stores and executes a user-defined control program 106 to effect decision-making in connection with the controlled process. Such programs can include, but are not limited to, ladder logic, sequential function charts, function block diagrams, structured text, or other such programming structures.

Figure 2:
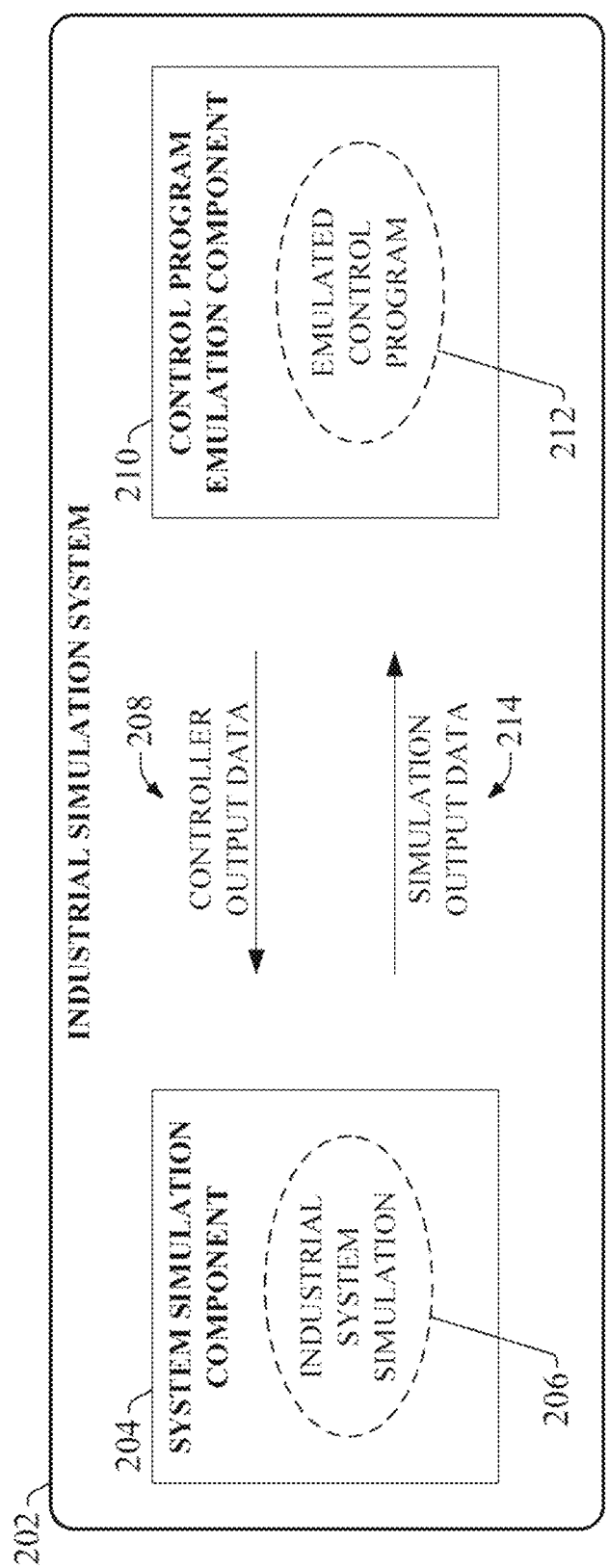
FIG. 2 is block diagram of an example industrial simulation system.

Many system designers use simulations of a plant or industrial system to validate an industrial control program prior to deployment, to predict the effects of a change to the industrial process or control program (e.g., to estimate the change in product yield, energy or material consumption, costs, etc.). FIG. 2 is block diagram of an example industrial simulation system 202. Industrial simulation system 202 includes a system simulation component 204 that executes an industrial system simulation 206, which simulates various aspects of a physical industrial automation system or process to be regulated by an industrial controller. Industrial simulation system 202 also includes a control program emulation component 210 that executes an emulated control program 212 analogous to the industrial control program that will be installed and executed on the physical industrial controller used to monitor and control the real industrial automation system. The industrial system simulation 206 interfaces with the emulated control program 212 to exchange simulated I/O data (e.g., controller output data 208 and simulation output data 214), thereby simulating real-time control of the industrial system or process. For example, if the industrial system simulation 206 comprises a model of an industrial robot arm, the emulated control program 212 can be configured to manage movement of the arm.

Figure 3:
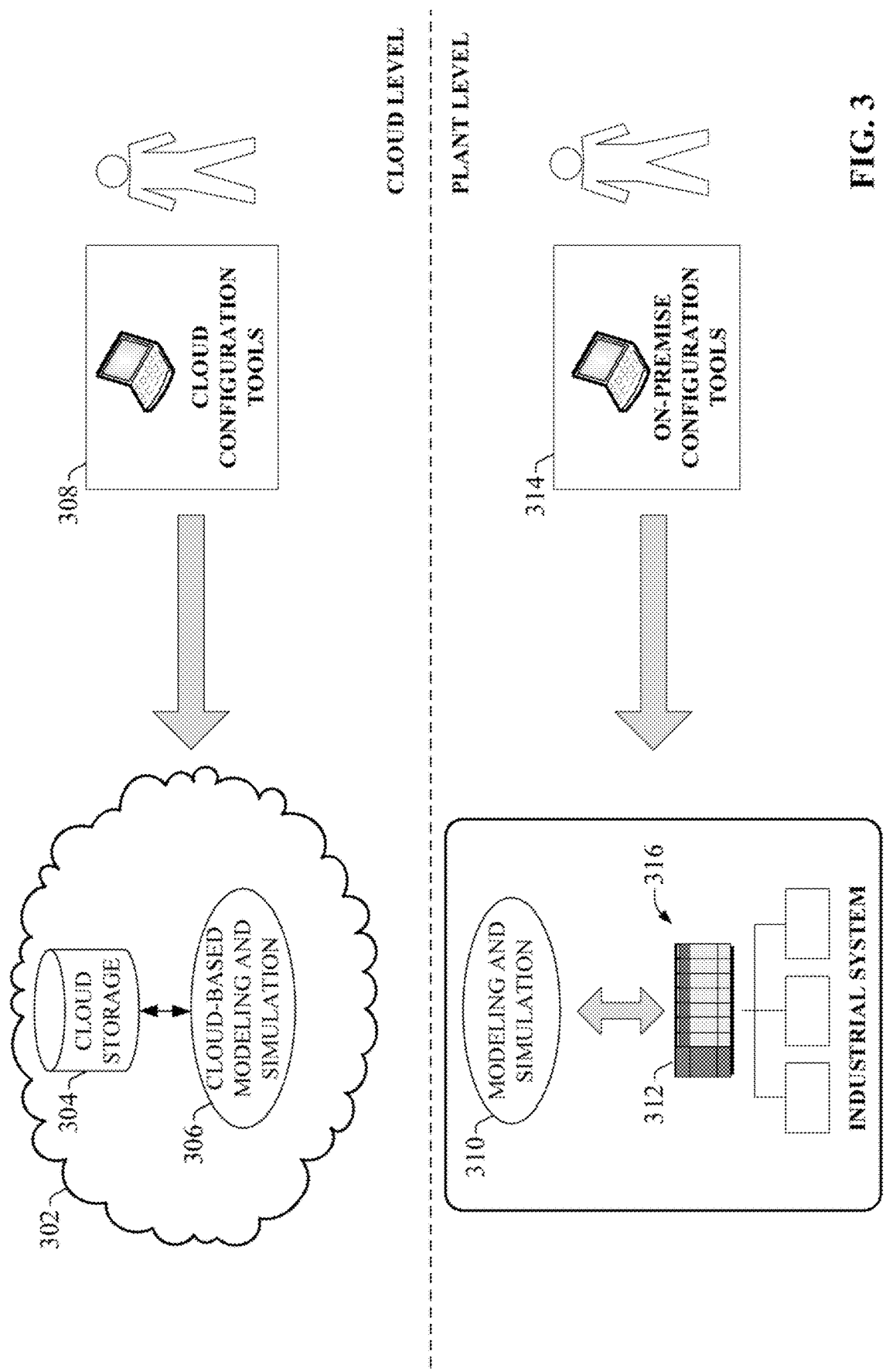
FIG. 3 is a diagram illustrating configuration of plant-level and cloud-level modeling and simulation systems.

Enterprise-level modeling and simulation of an industrial automation system, or even a distributed industrial enterprise comprising multiple inter-related facilities, could be achieved by modeling and simulating the systems in a cloud platform. FIG. 3 is a diagram illustrating configuration of plant-level and cloud-level modeling and simulation systems. In this example, a modeling and simulation system 310 on the plant level interacts with an on-premise industrial controller 312—either before deployment of the controller or during control of an industrial system 316—to perform system validation, modeling, analytics, operator training, or other functions. Modeling and simulation system 310 may execute, for example, on a workstation or simulation module residing on the plant floor. Similarly, a cloud-based modeling and simulation system 306 executing on a cloud platform may leverage data maintained in cloud storage 304—e.g., historical and/or near real-time data collected from one or more industrial devices—to facilitate simulation of an industrial system or process on the cloud. These cloud and on-premise simulation systems are decoupled, requiring separate configuration and software development tools to achieve enterprise level modeling of an industrial system. For example, modeling and simulation system 310 and industrial controller 312 may be configured using on-premise configuration tools 314, which may comprise industrial control program development software (e.g., a ladder logic development platform) and simulation building software. Cloud-based modeling and simulation system 306, which executes on a different type of platform in the cloud, must be configured using a different set of cloud configuration tools 308 not familiar to an industrial control system designer. Often, cloud-based analytics systems must be configured by data scientists with expertise in big data analytics.

Cloud-based industrial simulation systems would have considerable value in connection with operator training systems (OTSs). Such systems could effectively leverage the high performance and storage capabilities afforded by the cloud platform in an integrated OTS framework that accurately reproduces control and process scenarios for a given real-world industrial automation system. Operators and/or maintenance personnel could then interact with these simulated scenarios within the context of a training scenario. In general, operator training systems can be used to test the design of a new industrial automation system without putting the physical system at risk, to train new personnel in the proper operation of an industrial automation system, or to transfer domain expertise to new operators and engineers. Typically, operator training systems are based on ideal simulated versions of the controlled system or process. These simulations often require ad-hoc programming and customization to align the simulation as closely as possible to the physical system. As such, operator training systems created in this way are often complicated, monolithic, expensive, and do not accurately reproduce the behavior of the physical system with high fidelity.

To address these and other issues, one or more embodiments of the present disclosure provide a cloud-based operator training system that includes a snapshot management architecture. The snapshot management architecture provides a hybrid system for the generation of control system level scenarios and system-state snapshots, which can improve the fidelity of the training simulation. By implementing the simulation system on a cloud platform, the system can generate a large and growing set of snapshot files representing various control states and corresponding process states. These files can then be leveraged during operator training sessions to yield high fidelity simulated system operation.

Figure 4:
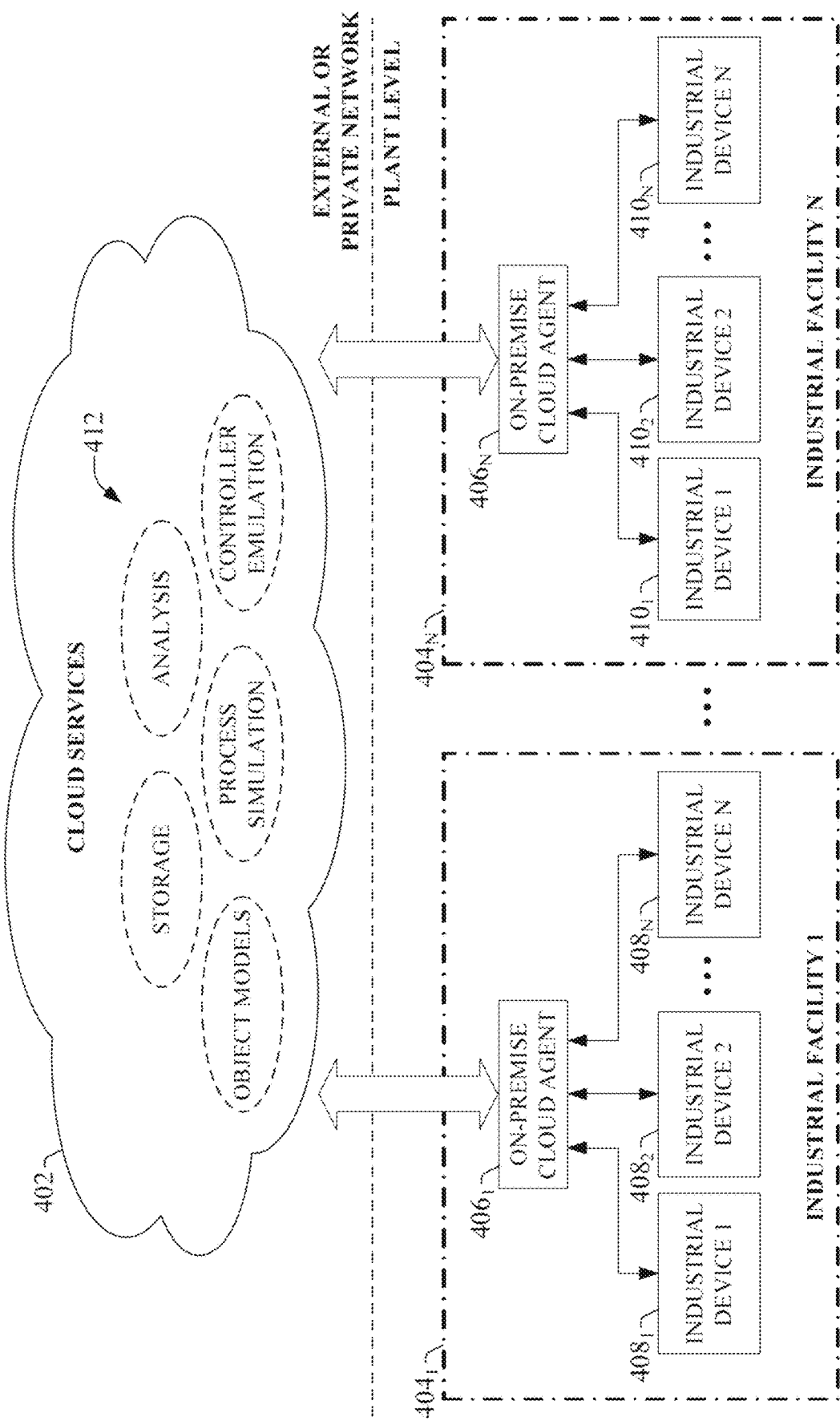
FIG. 4 is a high-level overview of an industrial enterprise that leverages cloud-based services.

FIG. 4 illustrates a high-level overview of an industrial enterprise that leverages cloud-based services. The enterprise comprises one or more industrial facilities 404, each having a number of industrial devices 408 and 410 in use. The industrial devices 408 and 410 can make up one or more automation systems operating within the respective facilities 404. Example automation systems can include, but are not limited to, batch control systems (e.g., mixing systems), continuous control systems (e.g., PID control systems), or discrete control systems. Industrial devices 408 and 410 can include such devices as industrial controllers (e.g., programmable logic controllers or other types of programmable automation controllers); field devices such as sensors and meters; motor drives; operator interfaces (e.g., human-machine interfaces, industrial monitors, graphic terminals, message displays, etc.); industrial robots, barcode markers and readers; vision system devices (e.g., vision cameras); smart welders; or other such industrial devices.

Example automation systems can include one or more industrial controllers that facilitate monitoring and control of their respective processes. The controllers exchange data with the field devices using native hardwired I/O or via a plant network such as Ethernet/IP, Data Highway Plus, ControlNet, Devicenet, or the like. A given controller typically receives any combination of digital or analog signals from the field devices indicating a current state of the devices and their associated processes (e.g., temperature, position, part presence or absence, fluid level, etc.), and executes a user-defined control program that performs automated decision-making for the controlled processes based on the received signals. The controller then outputs appropriate digital and/or analog control signaling to the field devices in accordance with the decisions made by the control program. These outputs can include device actuation signals, temperature or position control signals, operational commands to a machining or material handling robot, mixer control signals, motion control signals, and the like. The control program can comprise any suitable type of code used to process input signals read into the controller and to control output signals generated by the controller, including but not limited to ladder logic, sequential function charts, function block diagrams, structured text, or other such platforms.

Although the example overview illustrated in FIG. 4 depicts the industrial devices 408 and 410 as residing in fixed-location industrial facilities 404, the industrial devices 408 and 410 may also be part of a mobile control application, such as a system contained in a truck or other service vehicle.

According to one or more embodiments, on-premise cloud agents 406 can collect data from industrial devices 408 and 410—or from other data sources, including but not limited to data historians, business-level systems, etc.—and send this data to cloud platform 402 for processing and storage. Cloud platform 402 can be any infrastructure that allows cloud services 412 to be accessed and utilized by cloud-capable devices. Cloud platform 402 can be a public cloud accessible via the Internet by devices having Internet connectivity and appropriate authorizations to utilize the services 412. In some scenarios, cloud platform 402 can be provided by a cloud provider as a platform-as-a-service (PaaS), and the services 412 (such as the manifest system described herein) can reside and execute on the cloud platform 402 as a cloud-based service. In some such configurations, access to the cloud platform 402 and the services 412 can be provided to customers as a subscription service by an owner of the services 412. Alternatively, cloud platform 402 can be a private or semi-private cloud operated internally by the enterprise, or a shared or corporate cloud environment. An example private cloud can comprise a set of servers hosting the cloud services 412 and residing on a corporate network protected by a firewall.

Cloud services 412 can include, but are not limited to, data storage, data analysis, control applications (e.g., applications that can generate and deliver control instructions to industrial devices 408 and 410 based on analysis of real-time system data or other factors), process simulation services, controller emulation services, visualization applications such as the cloud-based operator interface system described herein, reporting applications, Enterprise Resource Planning (ERP) applications, notification services, or other such services. Cloud platform 402 may also include one or more object models to facilitate data ingestion and processing in the cloud. If cloud platform 402 is a web-based cloud, cloud agents 406 at the respective industrial facilities 404 may interact with cloud services 412 directly or via the Internet. In an exemplary configuration, the industrial devices 408 and 410 connect to the on-premise cloud agents 406 through a physical or wireless local area network or radio link. In another exemplary configuration, the industrial devices 408 and 410 may access the cloud platform 402 directly using integrated cloud agents.

Ingestion of industrial device data in the cloud platform 402 through the use of cloud agents 406 can offer a number of advantages particular to industrial automation. For one, cloud-based storage offered by the cloud platform 402 can be easily scaled to accommodate the large quantities of data generated daily by an industrial enterprise, as well as growing numbers of snapshot files generated by the snapshot management architecture to be described in more detail below. Moreover, multiple industrial facilities at different geographical locations can migrate their respective automation data to the cloud for aggregation, collation, collective analysis, visualization, simulation, and enterprise-level reporting without the need to establish a private network between the facilities. Cloud agents 406 can be configured to automatically detect and communicate with the cloud platform 402 upon installation at any facility, simplifying integration with existing cloud-based data storage, analysis, or reporting applications used by the enterprise. In another example application, cloud-based diagnostic applications can monitor the health of respective automation systems or their associated industrial devices across an entire plant, or across multiple industrial facilities that make up an enterprise. Cloud-based lot control applications can be used to track a unit of product through its stages of production and collect production data for each unit as it passes through each stage (e.g., barcode identifier, production statistics for each stage of production, quality test data, abnormal flags, etc.). Moreover, cloud based control applications can perform remote decision-making for a controlled industrial system based on data collected in the cloud from the industrial system, and issue control commands to the system via the cloud agent. These industrial cloud-computing applications are only intended to be exemplary, and the systems and methods described herein are not limited to these particular applications. The cloud platform 402 can allow software vendors to provide software as a service, removing the burden of software maintenance, upgrading, and backup from their customers.

Figure 5:
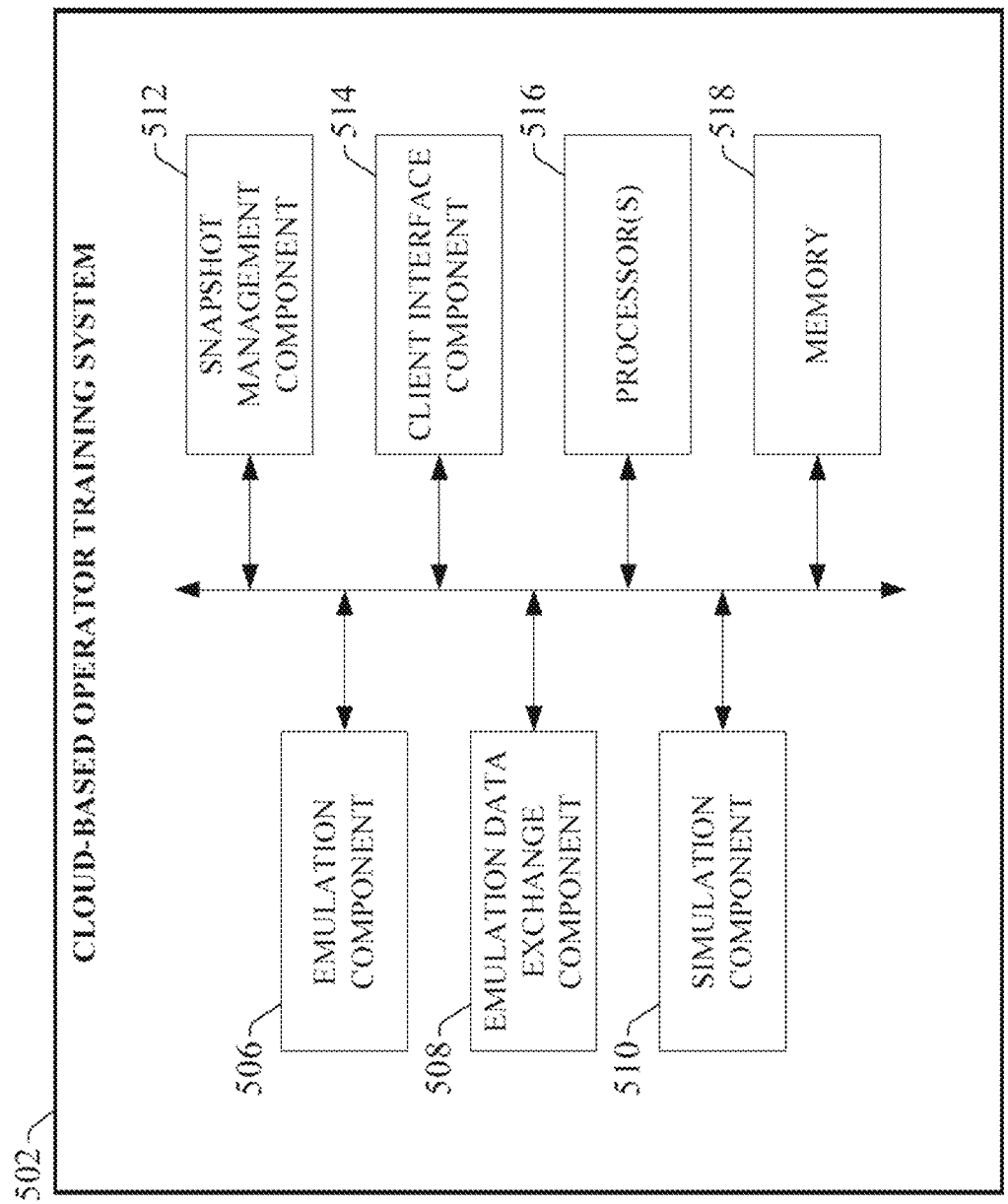
FIG. 5 is a block diagram of an example cloud-based operator training system.

FIG. 5 is a block diagram of an example cloud-based operator training system 502 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Cloud-based operator training system 502 can include an emulation component 506, an emulation data exchange component 508, a simulation component 510, a snapshot management component 512, a client interface component 514, one or more processors 516, and memory 518. In various embodiments, one or more of the emulation component 506, emulation data exchange component 508, simulation component 510, snapshot management component 512, client interface component 514, the one or more processors 516, and memory 518 can be electrically and/or communicatively coupled to one another to perform one or more of the functions of the operator training system 502. In some embodiments, components 506, 508, 510, 512, and 514 can comprise software instructions stored on memory 518 and executed by processor(s) 516. Operator training system 502 may also interact with other hardware and/or software components not depicted in FIG. 5. For example, processor(s) 516 may interact with one or more external user interface devices, such as a keyboard, a mouse, a display monitor, a touchscreen, or other such interface devices.

Emulation component 506 can be configured to execute a virtualized or emulated industrial controller on a cloud platform. For example, emulation component 506 can comprise a soft controller engine that can be programmed using standard industrial control programming software (e.g., a same programming platform used to program a hardware industrial controller), and can include an API layer that allows the controller engine to interface with cloud data storage, process simulations, and on-premise hardware devices. Emulation data exchange component 508 can be configured to provide connectivity between the emulation component's API, cloud-based simulations, distributed on-premise simulations, and/or cloud services.

Simulation component 510 can be configured to execute cloud-based simulations that interact with the virtualized controller executed by emulation component 506. Snapshot management component 512 can be configured to capture and store process states of the cloud-based simulations and control states of the emulated controller, and to leverage these stored snapshots in connection with executing the process simulation during a training session.

Client interface component 514 can be configured to exchange data with one or more client devices via an Internet connection. For example, client interface component 514 can deliver training interfaces to authorized client devices that allow a user to interact with the cloud-based simulations.

The one or more processors 516 can perform one or more of the functions described herein with reference to the systems and/or methods disclosed. Memory 418 can be a computer-readable storage medium storing computer-executable instructions and/or information for performing the functions described herein with reference to the systems and/or methods disclosed.

Figure 6:
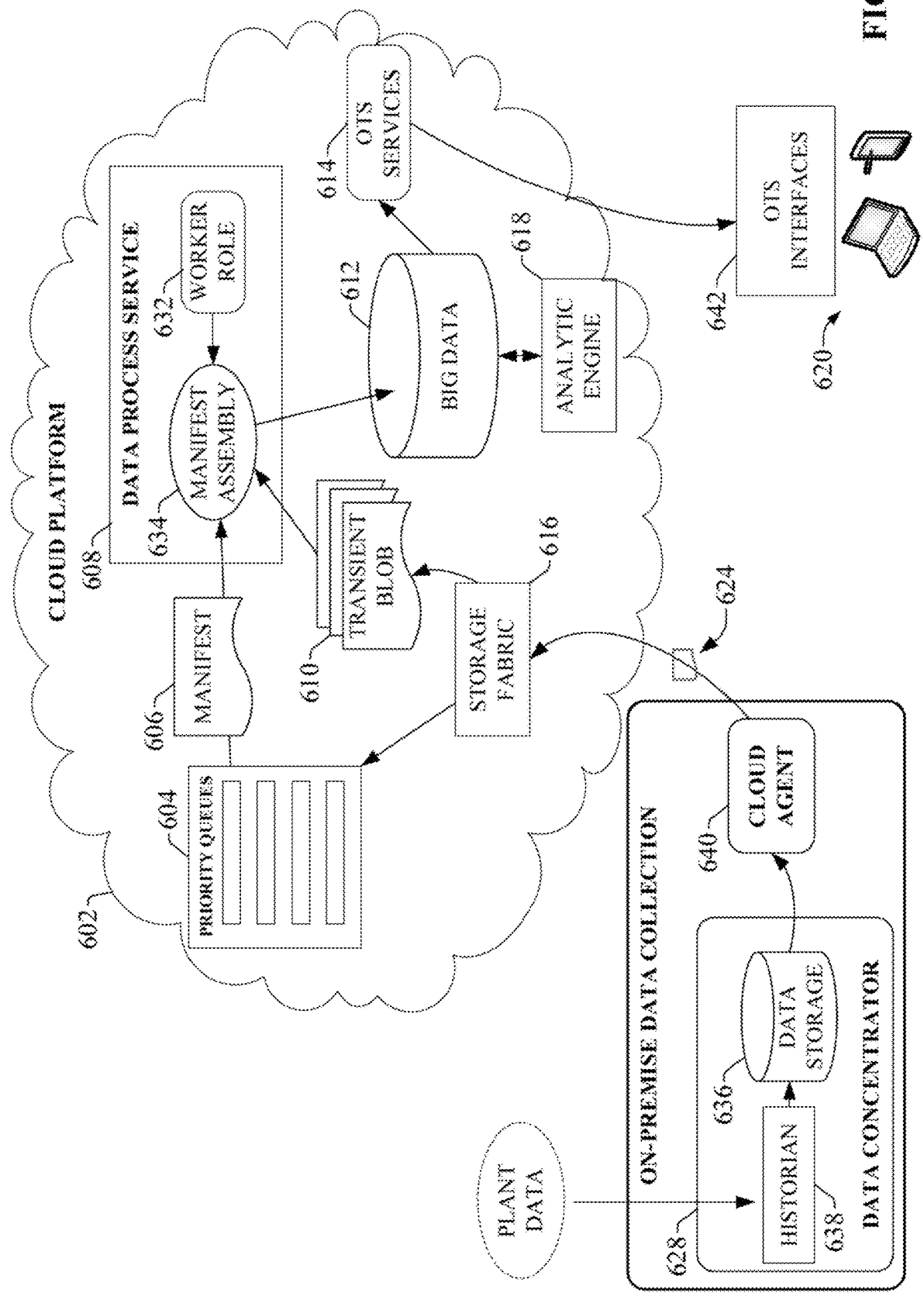
FIG. 6 is an overview of a system that leverages an agent-based cloud infrastructure to provide data collection and processing services to customer manufacturing sites.

The cloud-based simulation and operator training system described herein can leverages historical and/or real-time data collected into cloud storage from on-premise industrial devices. This data can be used by the system, for example, in connection with modeling the industrial system or process to be simulated on the cloud. Any suitable techniques for moving plant floor data to cloud storage for cloud-level analysis are within the scope of one or more embodiments of this disclosure. In some embodiments, a cloud agent architecture can be used to push industrial system data to the cloud platform. According to this cloud agent architecture, the industrial system data is collected by on-premise cloud agent devices, packaged into data packets, and pushed to the cloud platform for remote viewing. FIG. 6 is an overview of a system that leverages an agent-based cloud infrastructure to provide data collection and processing services to customer manufacturing sites. This system can provide remote collection and monitoring services in connection with cloud-based simulation and training.

In the example illustrated in FIG. 6, a data concentrator 628 collects plant data from one or more industrial assets (e.g., data generated by one or more industrial controllers or associated I/O devices) at a plant facility. These industrial assets can include industrial controllers that monitor and control industrial I/O devices, data servers and historians, motor drives, remote I/O interfaces that remotely interface groups of I/O devices to one or more of the industrial controllers, boilers or other industrial machines, or other such assets. For example, data concentrator 528 can monitor one or more controller tags defined in a tag archive and store data in local data storage 636 (e.g., a local structured query language, or SQL, server) associated with a historian 638. The collected data can include historical data (e.g., alarm history, status history, trend data, etc.), live data values read from the industrial assets, alarm data generated by the industrial assets, or other types of data.

An on-premise cloud agent 640 is configured to collect the live or historical data from the industrial assets, either directly or by accessing data storage 536 associated with data concentrator 628. Cloud agent 640 can execute on any suitable hardware platform (e.g., a server, a LINUX box, etc.), and acts as a generic gateway that collects data items from the various industrial assets on the plant network and packages the collected data according to a generic, uniform data packaging schema used to move the on-premise data to a cloud platform 602. Cloud agent 640 provides a software mechanism to dynamically link on-premise-to-cloud gateways. Cloud agent 640 provides an expandable data type schema that allows new data types to be added without the need to redeploy the monitoring system to the cloud.

During data collection, the cloud agent 640 can intelligently sort and organize the data based on defined criteria, including but not limited to time of occurrence and/or user-defined priorities. Cloud agent 640 can be, for example, a service (e.g., a Windows service) that periodically collects and transmits serialized and compressed data into the cloud domain using standard web services over HTTPS/SSL.

FIG. 6 depicts data concentrator 628 as the data source for cloud agent 640. This configuration can be useful if there are a large number of data points to monitor, since the data concentrator can 628 can link multiple industrial devices or other data sources to a single cloud agent 640. However, some embodiments of cloud agent 640 can collect data directly from the industrial assets themselves; e.g., through a common industrial protocol link, or through middleware applications such as OPC clients.

Figure 7:
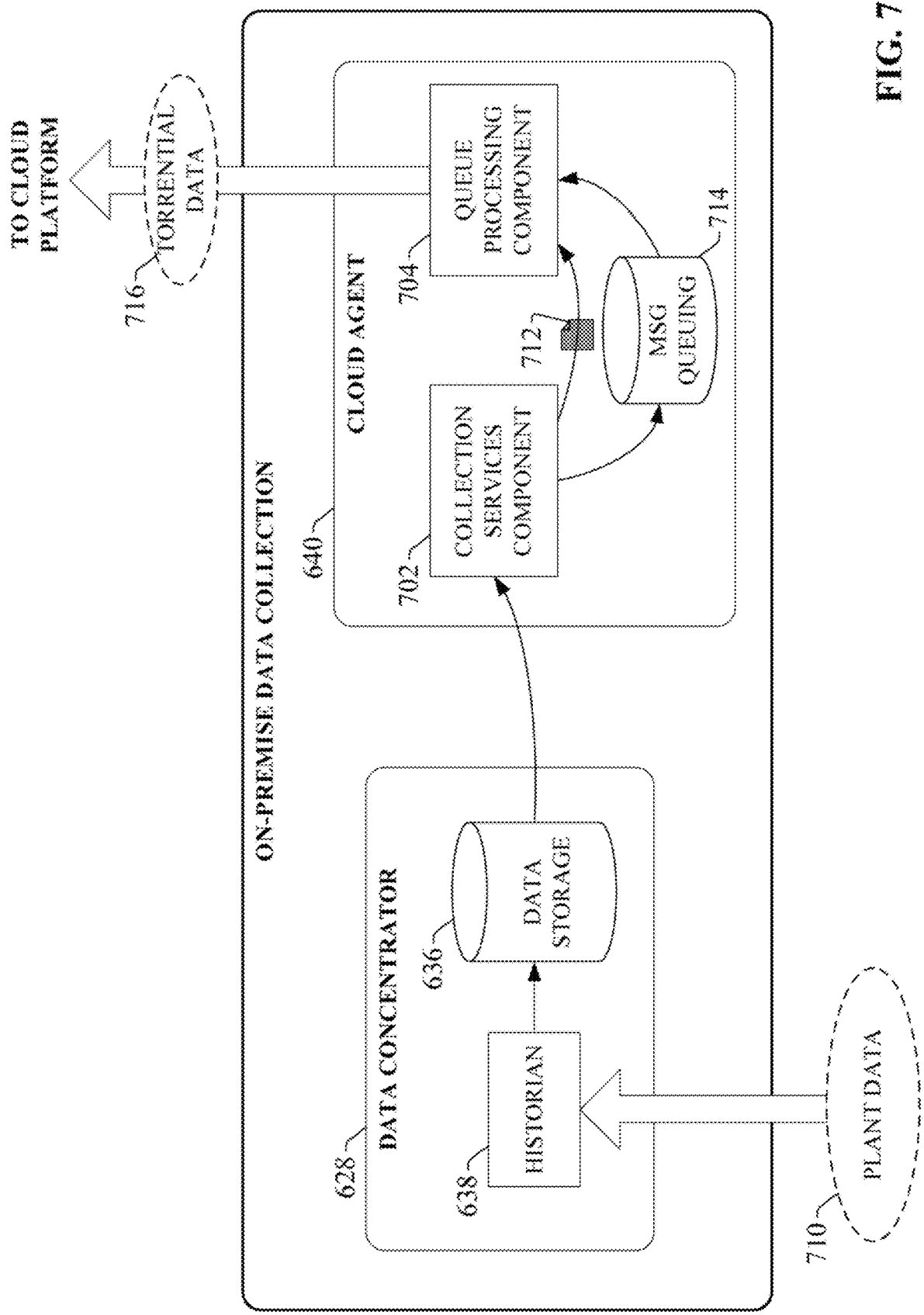
FIG. 7 is a block diagram illustrating cloud agent functionality.

Cloud agent functionality is illustrated in more detail with reference to FIG. 7. On-premise data collection is enabled by a collection of services that function as a virtual support engineer for processing data. Data concentrator 628 and cloud agent 640 respectively implement two main functions associated with data collection—data concentration using a historian 638 and associated data storage 636 (e.g., an SQL server), and cloud data enablement using cloud agent services executed by cloud agent 640. As noted above, plant data 710 is collected by data concentrator 628 at the plant facility. In an example scenario, plant data 710 may comprise stamping press time series sensor data, made up of thousands of data points updated at a rate of less than a second.

Collection services component 702 of cloud agent 640 implements collection services that collect device data, either from data concentrator's associated data storage (e.g., via an SQL query) or directly from the devices themselves via a common industrial protocol (CIP) link or other suitable communication protocol. For example, to obtain data from data concentrator 628, collection services component 702 may periodically run a data extraction query (e.g., an SQL query) to extract data from data storage 636 associated with data concentrator 628. Collection services component 702 can then compress the data and store the data in a compressed data file 712. Queue processing services executed by queue processing component 704 can then read the compressed data file 712 and reference a message queuing database 714, which maintains and manage customer-specific data collection configuration information, as well as information relating to the customer's subscription to the cloud platform and associated cloud services. Based on configuration information in the message queuing database 714, queue processing component 704 packages the compressed data file 712 into a data packet and pushes the data packet to the cloud platform. In some embodiments, the cloud agent 640 can support injecting data packets as torrential data 716.

Message queuing database 714 can include site-specific information identifying the data items to be collected (e.g., data tag identifiers), user-defined processing priorities for the data tags, firewall settings that allow cloud agent 640 to communicate with the cloud platform through a plant firewall, and other such configuration information. Configuration information in message queuing database 714 instructs cloud agent 640 how to communicate with the identified data tags and with the remote data collection services on the cloud platform.

In addition to collection and migration of data, one or more embodiments of cloud agent 640 can also perform local analytics on the data prior to moving the data to the cloud platform. This can comprise substantially any type of pre-processing or data refinement that may facilitate efficient transfer of the data to the cloud, prepare the data for enhanced analysis in the cloud, reduce the amount of cloud storage required to store the data, or other such benefits. For example, cloud agent 640 may be configured to compress the collected data using any suitable data compression algorithm prior to migrating the data to the cloud platform. This can include detection and deletion of redundant data bits, truncation of precision bits, or other suitable compression operations. In another example, cloud agent 640 may be configured to aggregate data by combining related data from multiple sources. For example, data from multiple sensors measuring related aspects of an automation system can be identified and aggregated into a single cloud upload packet by cloud agent 640. Cloud agent 640 may also encrypt sensitive data prior to upload to the cloud. In yet another example, cloud agent 640 may filter the data according to any specified filtering criterion (e.g., filtering criteria defined in a filtering profile stored on the cloud agent). For example, defined filtering criteria may specify that pressure values exceeding a defined setpoint are to be filtered out prior to uploading the pressure values to the cloud.

In some embodiments, cloud agent 640 may also transform a specified subset of the industrial data from a first format to a second format in accordance with a requirement of a cloud-based analysis application. For example, a cloud-based reporting application may require measured values in ASCII format. Accordingly, cloud agent 640 can convert a selected subset of the gathered data from floating point format to ASCII prior to pushing the data to the cloud platform for storage and processing. Converting the raw data at the industrial device before uploading to the cloud, rather than requiring this transformation to be performed on the cloud, can reduce the amount of processing load on the cloud side.

Cloud agent 640 may also associate metadata with selected subsets of the data prior to migration to the cloud, thereby contextualizing the data within the industrial environment. For example, cloud agent 640 can tag selected subsets of the data with a time indicator specifying a time at which the data was generated, a quality indicator, a production area indicator specifying a production area within the industrial enterprise from which the data was collected, a machine or process state indicator specifying a state of a machine or process at the time the data was generated, a personnel identifier specifying an employee on duty at the time the data was generated, or other such contextual metadata. In this way, cloud agent 640 can perform layered processing of the collected data to generate meta-level knowledge that can subsequently be leveraged by cloud-based analysis tools to facilitate enhanced analysis of the data in view of a larger plant context.

To ensure secure outbound traffic to the cloud, one or more embodiments of cloud agent 640 can support HTTPS/SSL, certificate authority enabled transmission, and/or unique identity using MAC addresses. Cloud agent 640 can also support store-and-forward capability to ensure data is not lost if the agent becomes disconnected from the cloud.

Returning now to FIG. 6, cloud agent 640 sends compressed data packet 624 to the cloud-based data collection and monitoring system on cloud platform 602 via a cloud storage fabric 616. The data packet 624 conveys parameters and data (compressed and serialized) used by the cloud-side services to reconstruct the domain data structure in the cloud using auxiliary tenant-level manifests. The cloud services direct remote storage of the received data into preconditioned transient blobs 610. The cloud platform 602 can use agent reasoning and collective bargain features to determine a data storage locale.

Through the configuration interface provided by cloud agent 640, users at the plant facility can dynamically configure one or more priority queues 604 that respectively define how the data packets are processed in the cloud platform 602. For example, separate queues may be defined for alarms, live data, and historical data, allowing data to be organized according to these data types. The historical data queue can relate to time-series records, which can be accessed through an application programming interface (API) (e.g., an SQL API or other suitable API). The alarms queue can relate to abnormal situations, where the alarm data can also be accessed through the API. This alarms queue can comprise multiple queues associated with different alarm priorities, to allow for individual processing for different alarms having different levels of criticality. In some embodiments, servers, controllers, switches, etc., can be monitored using a number of protocols, and at a certain point (e.g., at the end of a monitoring cycle) alarms can be queued and cloud agent 640 can send the alarms to the cloud. Alarms can be reactive (e.g., alarms that trigger when a motor fails, when a CPU crashes, when an interlock is tripped, etc.) or proactive (e.g., a monitoring system may track consumables on a machine and generate an alarm when time to reorder, monitor cycle counts on a machine and generate an alarm when to schedule preventative maintenance, generate an alarm when temperatures fall outside defined bandwidths, send a notification when a computer's memory is 80% full, etc.).

The live data queue can relate to substantially real-time monitored data, such as current temperatures, current pressures, etc. The live data values can also be accessed through the API (e.g., a SQL API). The queues described above are not intended to be limiting, and it is to be appreciated that other types of priority queues can be defined according to the needs of the end user. For example, queues may be defined for specific devices or device types (e.g., motor drives) for uploading of device parameter and/or performance data.

In some embodiments, cloud agent 640 can allow the user to define these priority queues 604 from the on-site location and to define how data in each queue is handled. For example, the user can define, for each queue, an upload frequency, a priority level (e.g., which data queues should take processing priority over other data queues), identities of cloud partitions or databases in which data from the respective queues should be stored, and other such information. In an example scenario, the live data queue may be defined to process live data values that are to be used by a remote operator interface application to view substantially real-time data from the plant facility, while historical data queue may be used to process historian data for archival storage in a historical database on cloud storage. Accordingly, the live data queue may be assigned a higher priority relative to the historical data queue, since data in the live data queue is more time-critical than data in the historical queue.

Through cloud agent 640, users can assign priorities to respective data tags or tag groups at the customer site. These priority assignments can be stored in the message queuing database 714 of the cloud agent 640. Accordingly, when queue processing component 704 packages the collected data to be moved to the cloud platform, the collected data items can be packaged into data packets according to priority (as defined in message queuing database 714), and the respective data packet headers populated with the appropriate priority level. If access to the cloud is unavailable, data will continue to be collected by collection services component 702 and stored locally on the cloud agent in local storage associated with collections services. When communication to the cloud is restored, the stored data will be forwarded to cloud storage. Queue processing services can also encrypt and send storage account keys to the cloud platform for user verification.

Message queuing services implemented by queue processing component 704 of cloud agent 640 encapsulates or packages the compressed data file by adding customer-specific header information to yield a compressed data packed (e.g., compressed data packet 624 of FIG. 8 described below). For example, the queue processing component 704 can access a message queuing database (e.g., message queuing database 714 of FIG. 7), which stores customer site configuration information and manages the customer's subscription to the cloud platform services. The message queuing database may include such information as a customer identifier associated with the customer entity associated with the industrial enterprise, a site identifier associated with a particular plant facility from which the data was collected, a priority to be assigned to the data (which may be dependent on the type of information being sent; e.g., alarm data, historical data, live operational data, etc.), information required to facilitate connection to the customer's particular cloud fabric, or other such information. The information included in the header is based on this customer-specific information maintained in the message queuing database.

Figure 8:
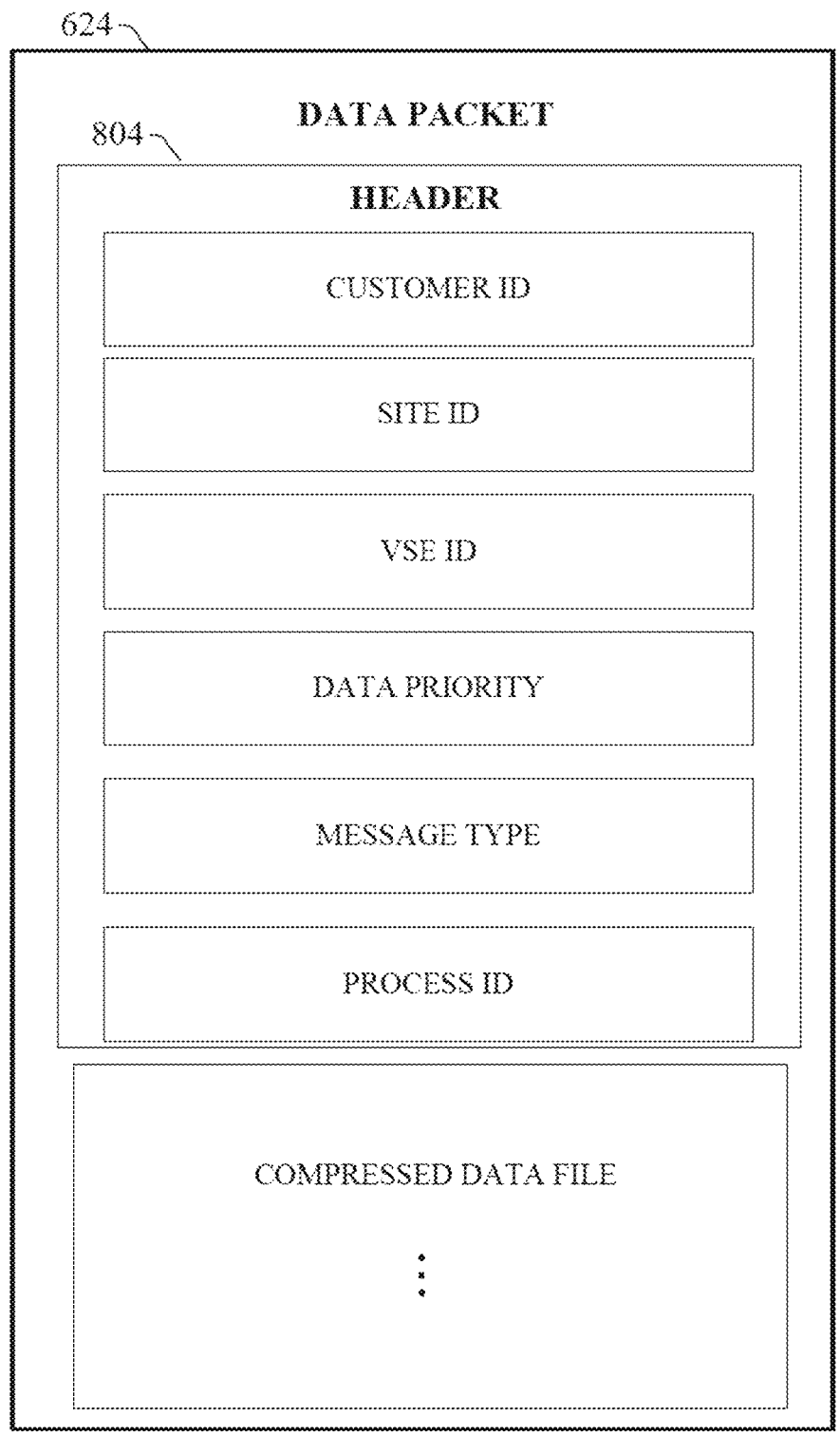
FIG. 8 is an example compressed data packet.

An example compressed data packet is illustrated in FIG. 8. As shown, the cloud agent's message queuing services add a header 804 to compressed data file 712 to yield the compressed data packet 624. The header 804 contains customer-specific data read from message queuing database 714. For example, header 804 can include a unique customer identifier, a site identifier representing a particular plant facility, a virtual support engineer identifier, a data priority for the data in the compressed data file 712, a message type, and a process identifier that specifies a particular manifest application on the cloud platform that should be used to process the data on the cloud side. Packaging the data in this way can allow data from diverse data sources to be packaged together using a uniform, generic data packaging schema so that the data can be moved to the cloud infrastructure.

When cloud agent 640 sends a data packet to the cloud-based remote processing service, the service reads the packet's header information to determine a priority assigned to the data (e.g., as defined in a data priority field of the data packet) and sends the data packet (or the compressed data therein) to a selected one of the user defined priority queues 604 based on the priority. On the other side of the priority queues 604, a data process service 608 processes data in the respective priority queues 604 according to the predefined processing definitions. The data processing service includes a worker role 632 that determines how the queued data is to be processed based on manifests (e.g., system manifests, tag manifests, and metric manifests) stored in a customer-specific manifest assembly 634. Manifests define and implement customer-specific capabilities, applications, and preferences for processing collected data in the cloud. Manifests can be dynamically uploaded by a user at the plant facility through cloud agent 640, which facilitates dynamic extension of cloud computing capability.

For example, if new data points are to be added to the data collection system that require creation of a new data queue, the user can interact with cloud agent 640 to configure a new manifest for the new queue, the manifest defining such aspects as processing priority for the data, upload frequency for the data, where the data is to be routed or stored within cloud storage, and other such information. Cloud agent 640 can then upload the new manifest 606 together with the data (or independently of the data). The new manifest 606 is then added to the customer's manifest assembly 634 with the other manifests defined for the customer, so that worker role 632 can leverage the new manifest 606 to determine how data in the new queue is to be processed. This new manifest 606 need only be uploaded to the cloud-based remote monitoring service once. Thereafter, data placed in the new priority queue will be processed by worker role 632 according to the new manifest 606 stored in the customer's manifest assembly 634. For example, the manifest may define where the data is to be stored within cloud storage (e.g., in a historical database, and Alarms and Live Data database, big data storage 612, etc.), and whether processing of the new data queue is to take priority over other data queues. In some embodiments, the manifest assembly 634 may only accept a new manifest if the manifest is accompanied by a unique key associated with the client.

Once the cloud-based infrastructure has processed and stored the data provided by cloud agent 640 according to the techniques described above, the data can be processed by cloud-based services executing on the cloud platform, such as the cloud-based simulation and operator training system described herein. For example, as will be described in more detail herein, the operator training system (OTS) services 614 can leverage the stored data in connection with generating a high-fidelity simulation of a physical plant-floor industrial system or process. The OTS services 614 can also execute an industrial controller emulation that emulates control of the industrial automation system or process by the physical controller located on the plant floor. The OTS services 614 can serve OTS interfaces 642 to one or more client devices 620. These interfaces 642 allow a user to interact with the cloud-based simulation in the context of an operator training scenario.

Figure 9:
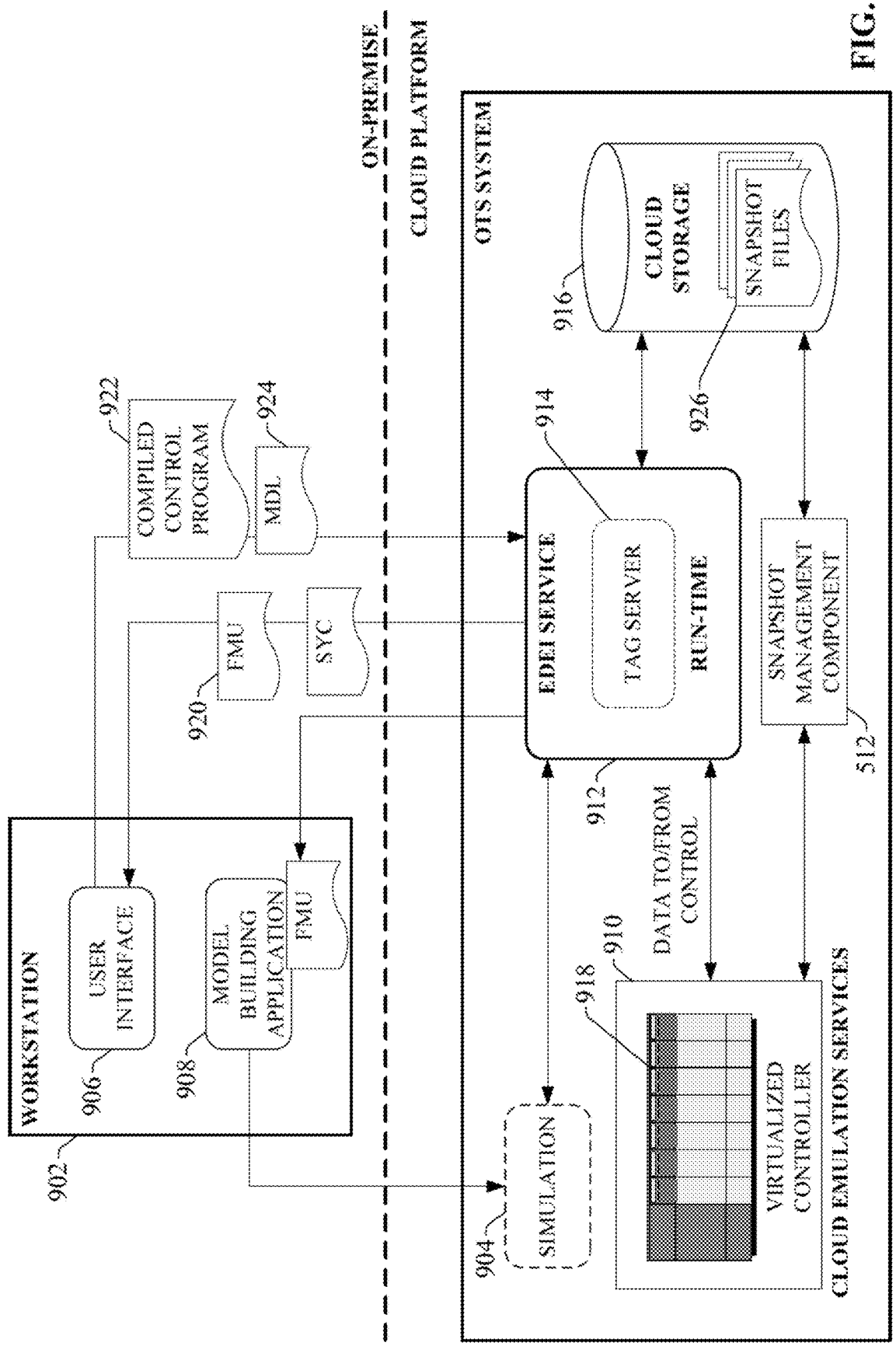
FIG. 9 is a diagram illustrating runtime of a cloud-based simulation and emulation system that includes a snapshot management component for creation of operator training scenarios.

FIG. 9 is a diagram illustrating runtime of a cloud-based simulation and emulation system that includes a snapshot management component for creation of operator training scenarios. According to one or more embodiments, the emulation component of the cloud-based operator training system can execute a virtualized controller 918 on the cloud platform. The virtualized controller 918 is driven by a controller engine that serves as a core component of the cloud-based operator training system, and runs on an industrial controller emulation platform that allows the virtualized controller 918 to be programmed using the same programming tools and programming platforms used to program hardware controllers (e.g., ladder logic, sequential function chart, structured text, etc.). This allows the virtualized controller 918 to be programmed and configured by plant engineers, rather than requiring the services of a data scientist or cloud analytics specialist.

The simulation component 510 of the cloud-based emulation and analytics system can also execute a cloud-based simulation 904 that models one or more aspects of an industrial system (e.g., an industrial machine or process, a work area, etc.). Simulation 904 interacts with virtualized controller 918 in order to simulate control of the modeled machine or process by the control program executed by virtualized controller 918. Coordinated interaction between simulation 904 and virtualized controller 918 is achieved using an emulation data exchange interface (EDEI) of the emulation runtime engine on the cloud platform. In the example depicted in FIG. 9, simulation 904 models an industrial system or process for which training is to be provided. The simulation 904 may be generated and maintained by a model building application 908 that executes on workstation 902, which may be any suitable on-premise computing device (e.g., a desktop, laptop, or tablet computer, etc.). On the cloud platform, emulation services 910 provided by the emulation component execute virtualized controller 918. Simulation 904 exchanges information with virtualized controller 918 via the EDEI service 912. The EDEI service 912 provides connectivity among the application program interfaces of the cloud emulation services 910, simulation 904, and other cloud services executing on the cloud platform.

EDEI service 912 includes a tag server 914 that maps simulated I/O data between simulation 904 and virtualized controller 918. EDEI service 912 can also map I/O data for streaming between the cloud platform and on-premise devices (e.g., industrial devices making up the physical industrial system or process on the plant floor). In this example, tag server 914 defines data to be exchanged between simulation 904 and the virtualized controller 918 executed by the cloud emulation services 910. However, the tag server 914 can also define data mappings between virtualized controller 918 and other devices, including but not limited to on-premise industrial controllers or other industrial devices. To facilitate mapping between data points of simulation 904 and virtualized I/O points of the virtualized controller 918, the user may provide information regarding the simulation model—e.g., an MDL file 924—to the EDEI service 912. Tag server 914 may use information contained in the MDL file 924 to link simulation I/O points with I/O points of the virtualized controller. Based on the I/O data mapping defined by the tag server 914, the EDEI service 912 will exchange the defined data items between simulation 904 and virtualized controller 918.

A functional mock-up unit (FMU) is established by exchange of FMU files 920 between EDEI service 912 and simulation 904. Virtualized controller 918 can be programmed remotely using workstation 902, which executes a standard industrial controller programming platform (e.g., a ladder logic development platform). In particular, a user at workstation 902 can develop a control program and send the compiled control program 922 to the EDEI service 912, which passes the control program to the virtualized controller for execution.

During runtime, tag server 914 exchanges data between simulation 904 and virtualized controller 918 on the cloud platform. The EDEI service 912 may also leverage cloud storage 916 to retrieve or store data relating to the simulation session. The simulation session may be monitored by a user via a dashboard or OTS interface (e.g., OTS interface 642 shown in FIG. 6) or other graphical interface served to the user's client device. The OTS interface can also provide interactive controls that allow the user to interact with the simulation 904 and virtualized controller 918 in the context of an operator training scenario.

In order to accurately simulate behaviors and responses of the physical industrial system or process being modeled by simulation 904, the cloud-based OTS system can leverage previously captured states of both the simulated system and the emulated virtual controller. This state information can be stored on cloud storage 916 in the form of snapshot files 926, and used by the cloud-based OTS system during a training simulation in order to accurately recreate a state or behavior of the simulated system in response to an operator action, and further in view of a current state of the virtualized controller 918 (e.g., the current value of the various I/O points, a current state of the program being executed by the virtualized controller 918, etc.). Fidelity of the simulation improves as the number of snapshot files 926 increases. In order to generate a large collection of snapshot files 926 for use by the OTS system, the system includes a snapshot management component 512 configured to capture and store states of the simulation 904 and corresponding states of the virtualized controller 918 during a training session.

Figure 10:
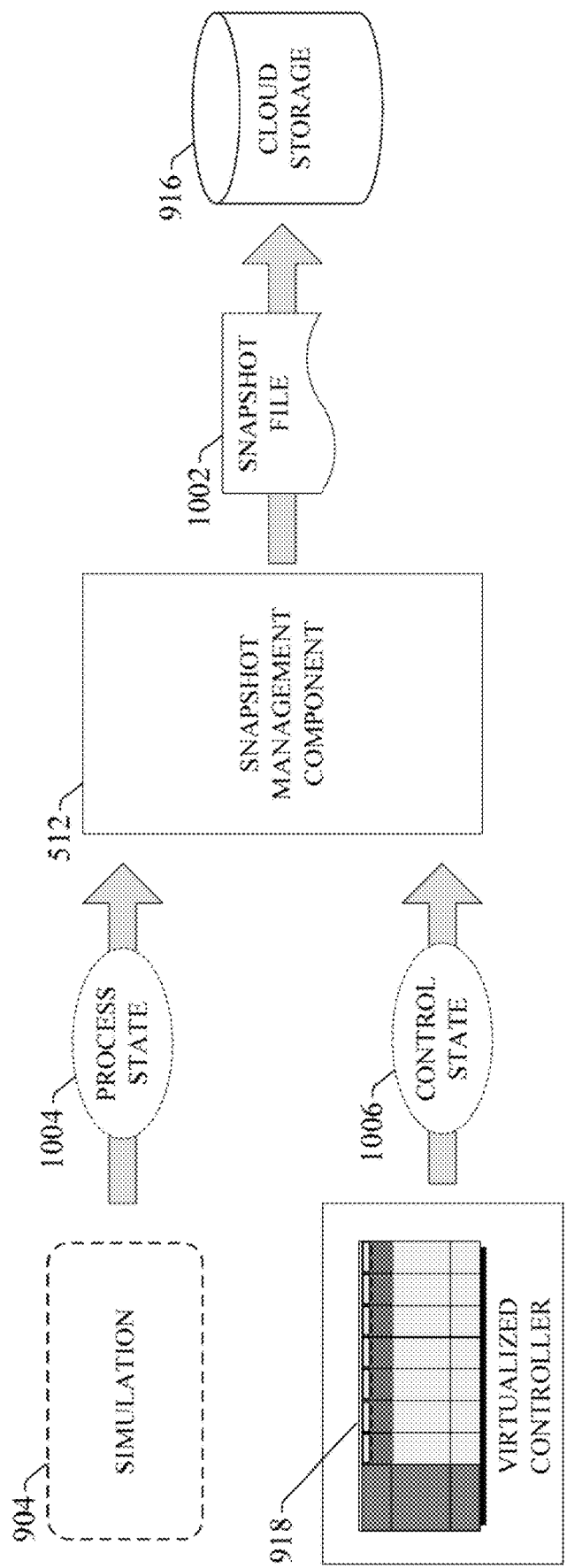
FIG. 10 is a diagram illustrating generation and storage of snapshot files by snapshot management component.

FIG. 10 illustrates generation and storage of snapshot files by snapshot management component 512. In response to a defined trigger condition during a simulation and/or training session (to be described in more detail below), the snapshot management component 502 captures a process state 1004 of the simulation 904. This process state 1004 represents one or more states of the simulated industrial system or process at the time of the trigger condition, and may include simulated status of one or more industrial devices or components comprising the simulation (e.g., a pressure, a temperature, a position, a speed, an alarm condition, etc.). The snapshot management component also captures a corresponding control state 1006 of the virtualized controller 918 at the time of the trigger. The control state 1006 can represent the values of the virtualized controller's I/O at the time of the trigger (e.g., analog and digital input and outputs), as well as the state of the control program or routine being executed by the virtualized controller. The snapshot management component 502 records the process state and its corresponding control state 1006 into a snapshot file 1002 and stores the file on cloud storage 916. The system continues to generate and store a growing collection of snapshot files for the simulated system over the course of multiple simulation executions.

Figure 11:
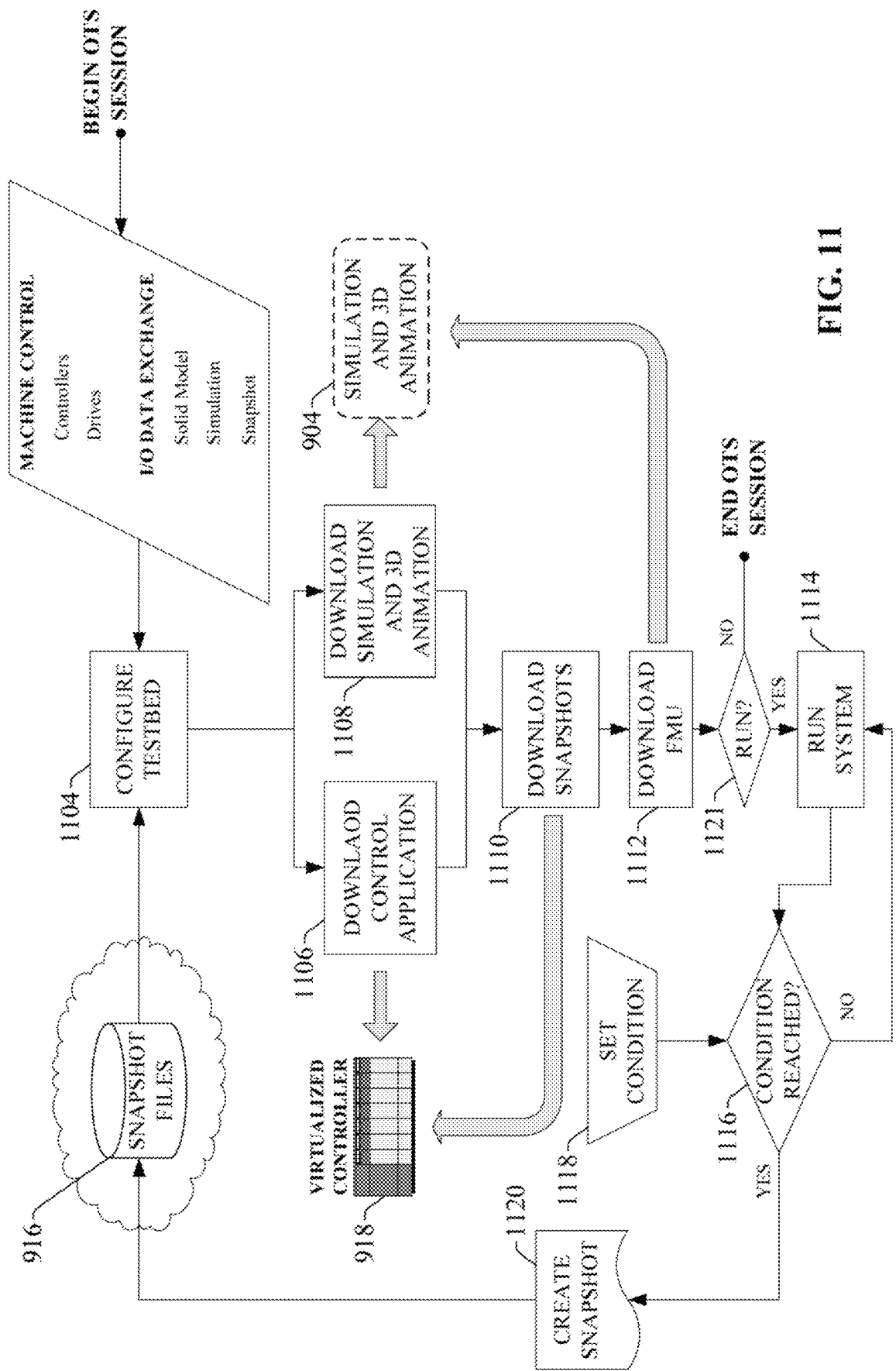
FIG. 11 is a flow diagram illustrating an example sequence of events carried out by an OTS system for generating and storing snapshot files.

FIG. 11 is a flow diagram illustrating an example sequence of events carried out by the OTS system described herein for generating and storing snapshot files. When an operator training session is initiated, the system first configures the simulation testbed at 1104. This can involve, for example, loading the appropriate machine simulation and virtualized controller, configuring the I/O data exchange between the simulation and the virtualized controller (e.g., by configuring the tag server 914 of the EDEI service 912), retrieving any snapshot files previously generated for the simulation from cloud storage 916, or other preliminary system configuration steps. The system then configures virtualized controller 918 and simulation 904 by downloading the control application to the virtualized controller 918 at 1106, and downloading the simulation and 3D animation to the simulation 904 at 1108. Control states defined by the snapshot files are then downloaded to the virtualized controller 918 at 1110. At 1112, a functional mock-up unit (FMU) file, which establishes a communication interface between simulation 904 and virtualized controller 918, is downloaded to the simulation 904.

Once the virtualized controller 918 and simulation (with associated 3D graphics) are configured, a determination is made at 1121 whether the simulation is to be run. If so, the simulation is run at 1114 (otherwise, the OTS session ends). During the simulation, the OTS system simulates control of the machine or process (modeled by simulation 904) by the industrial controller represented by the virtualized controller 918. During this time, users can interact with the simulated system via OTS interfaces served to a workstation or other client device by the OTS system. The OTS interface allow the user to simulate interaction with and operation of the machine or process represented by simulation 904. The interface also provides graphical and/or alphanumeric feedback to the user indicating the state or behavior of the machine and/or the controller in response to the simulated operator interactions. This can include, for example, graphically conveying the behavior of the machine via a 3D graphic representation.

Prior to or during the simulation, a stop condition is set at 1118. This stop condition defines a system state at which the simulation generates a snapshot file. The condition can define one or more simultaneous conditions of the process and/or control state that must be true in order to trigger generation of the snapshot file. An example condition may specify, for example, that the snapshot is to be taken when a specified pressure reaches a defined setpoint value, and a specified temperature falls below a defined value.

When it is determined at 1116 that the condition set at step 1118 has been reached, the process state of the simulation 904 and the corresponding control state of the virtualized controller 918 is captured by the snapshot management component, which creates a snapshot file at 1120 recording these states. The resulting snapshot file is then stored in cloud storage 916 along with previously collected snapshot files for the simulated system. As noted above, these snapshot files are referenced by the OTS system to accurately model the behavior of the simulated machine or process under different operating conditions or in response to different operator interactions.

Figure 12:
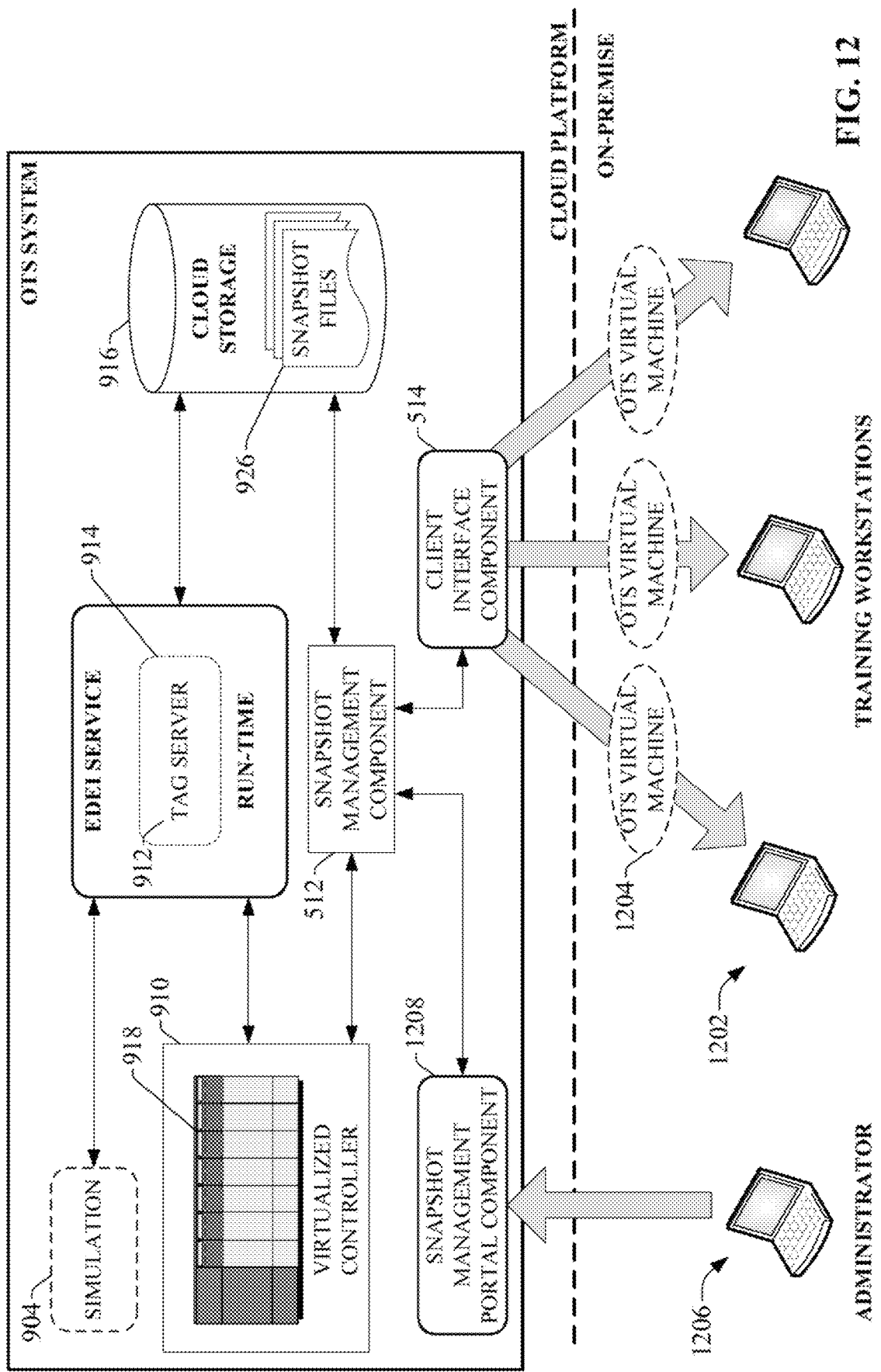
FIG. 12 is a diagram of an architecture for distributing OTS interfaces to user workstations to facilitate training interaction with a cloud-based simulation.

FIG. 12 is a diagram of an architecture for distributing OTS interfaces to user workstations to facilitate training interaction with the cloud-based simulation. The cloud-based OTS system includes a client interface component 514 that can serve OTS virtual machines 1204 to one or more workstations 1202 or other client devices. Workstations 1202 may comprise, for example, training workstations located in a training room. Since the cloud-based operator training system resides and executes on the cloud platform, multiple workstations or client devices can interact with the simulation simultaneously. The client interface component 514 can serve the OTS virtual machines to authorized users via the workstations or other internet-capable personal device.

The OTS system architecture also includes a snapshot management portal component 1208, which acts as an administrative and design portal through which an administrator (via an administrator client device 1206, such as a desktop computer, a laptop computer, a tablet computer, a personal device with internet capability, etc.) can manage the snapshot database and design training scenarios using the snapshot data. For example, the snapshot management portal component 1208 can serve an administration dashboard or interface to the administrator client device 1206 that allows the administrator to configure a training classroom by selecting one or more operating scenarios represented by corresponding subsets of the snapshot files 926. The selected scenarios will then be used by the system for the training session.

During the training session, the administrator—through the snapshot management portal component 1208—can instruct the OTS system to load the selected operating scenarios onto the OTS virtual machines 1204, which are then delivered to the training workstations 1202. The OTS virtual machines 1204 are instances of template virtual machines on the cloud platform that have been configured in accordance with the selected operating scenarios. That is, the system loads the template virtual machines with instances of the simulation 904, the emulated virtualized controller 918, the snapshot files corresponding to the selected operating scenarios, and any necessary synchronization units for synchronizing the simulation 904 with the virtualized controller 918. Client interface 514 then delivers instances of these configured virtual machines 1204 to workstations 1202.

Figure 13:
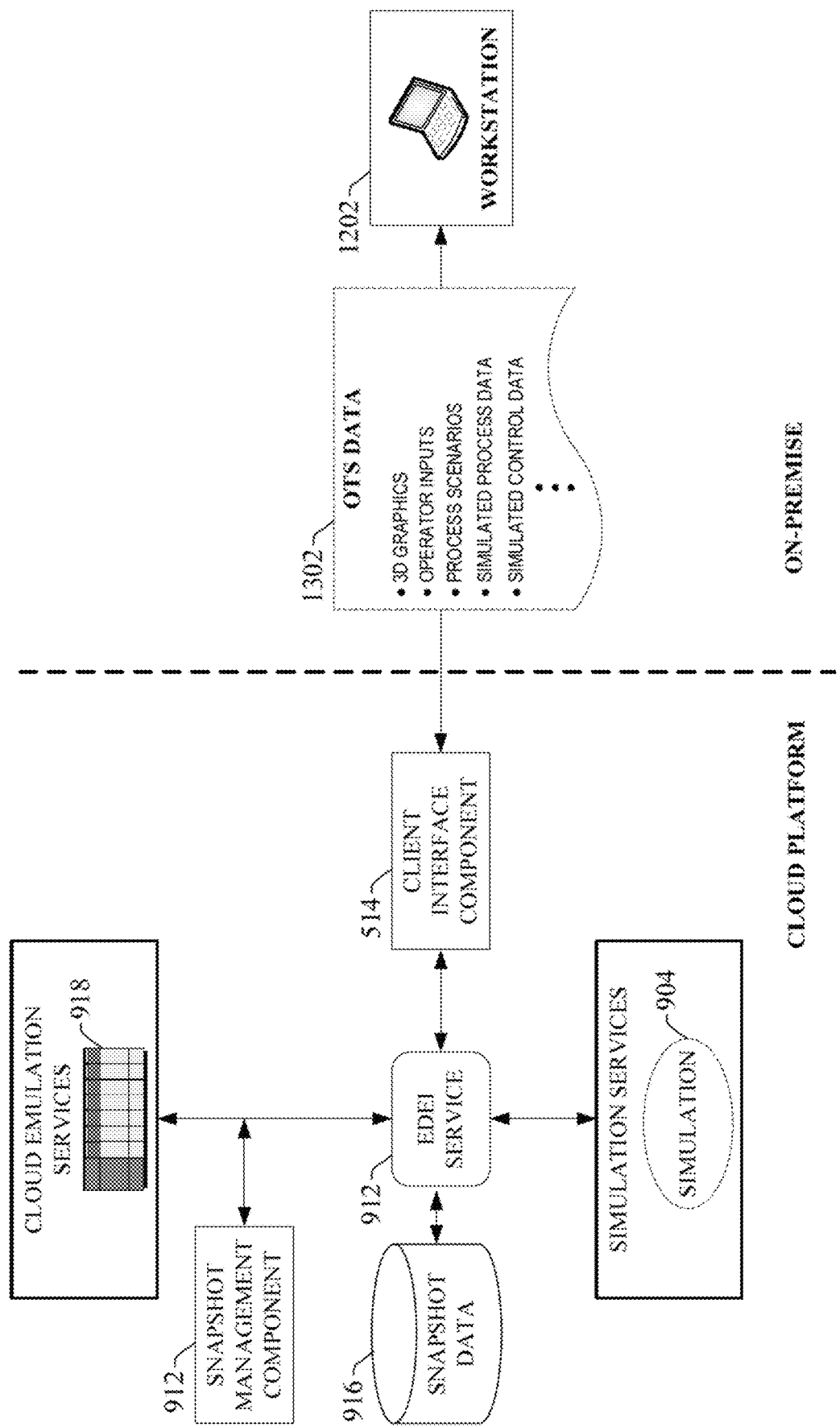
FIG. 13 is a diagram illustrating exchange of OTS data 1302 between the cloud-based OTS system and workstation.

The OTS virtual machines 1204 allow users at the workstations 1202 to view and interact with the simulation and virtualized controller 918 running the selected operating scenario (driven by the subset of the snapshot files 926 corresponding to the selected operating scenario). FIG. 13 is a diagram illustrating exchange of OTS data 1302 between the cloud-based OTS system and workstation 1202. OTS interfaces 1204 can render animated 3D graphics representing the machine or process being simulated by simulation 904. These graphical representations can convey a visual representation of the machine's current simulated state. The OTS interfaces also receive operator input via the workstations 1202 representing operator interactions with the simulated machine or process, including but not limited to input representing a control panel interaction (e.g., interaction with a push button, interaction with a selector switch, changing of a setpoint value, etc.), a change to the control program executing on the virtualized controller, or other such interactions. The machine state information conveyed to the users via the OTS interfaces 1204 are based in part on the snapshot files captured according to the process described above in connection with FIG. 11. EDEI service 912 provides connectivity between simulation 904, virtualized controller 918, and cloud storage 916, which stores captured snapshot files as well as data collected from the industrial system(s) by the tag server of the EDEI service.

Figure 14:
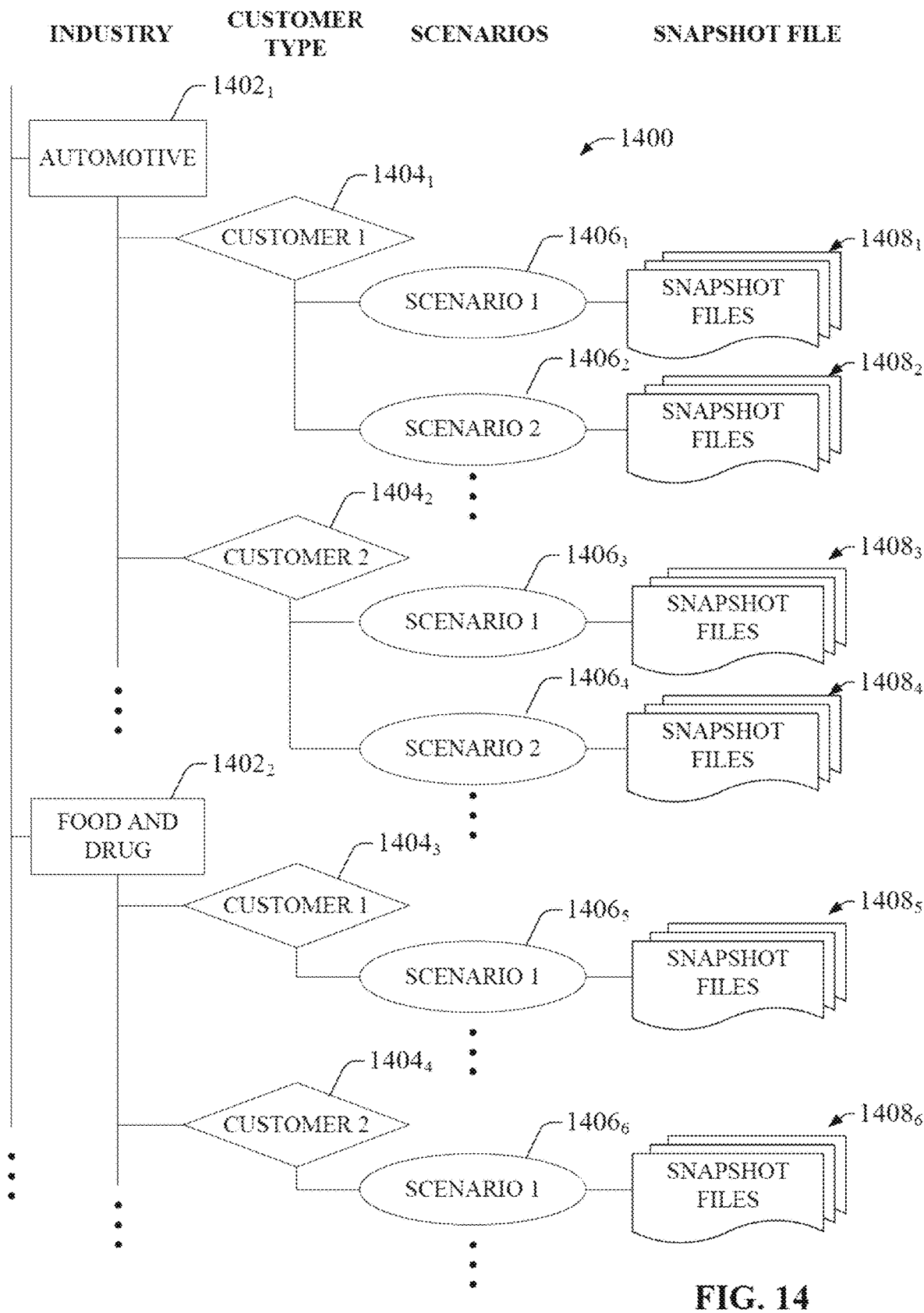
FIG. 14 an example, non-limiting organizational schema for industry-based categorization of snapshot files.

In some embodiments, the OTS training system can organize the stored snapshot files according to industry- and/or customer-specific categories to facilitate simplified management and location of the desired subset of snapshots corresponding to a selected operating scenario. FIG. 14 illustrates an example, non-limiting organizational schema 1400 for industry-based categorization of snapshot files. It is to be appreciated, however, that schema 1400 is only intended to be exemplary, and that substantially any snapshot classification schema is within the scope of this disclosure.

As new snapshot files are generated by the OTS system, snapshot management component 512 can classify the snapshots according to an industry category 1402, a customer type category 1404, and/or operating scenarios 1406. In some embodiments, these classifications can be organized hierarchically, as shown in FIG. 14. Example industry categories can include, but are not limited to, automotive, pharmaceutical, food and beverage, oil and gas, marine, fibers and textiles, mining, power generation, life sciences, pulp and paper, or other such industries. Snapshot management component 915 can classify snapshot files 1408 in cloud storage according to these various industrial categories. Each industry category can be subdivided into sub-categories corresponding to customer types within each industry, and each customer type can be associated with one or more simulation scenarios relevant to the corresponding industry and customer type. The snapshot management portal component 1208 can allow an administrator or other user to navigate this hierarchical classification schema in order to locate desired training scenarios within each industry, and to identify the sub-set of snapshot files 1408 corresponding to the selected scenario.

The cloud-based architecture for process simulation, controller emulation, and snapshot management described above can also be used for other functions instead of or in addition to operator training. For example, since the large collection of snapshot files generated and stored by the system captures a wide range of machine or process behaviors, scenario analysis can be performed on this snapshot information by a big data analysis system executing on the cloud platform. Such analysis could identify—based on the collection of observed system behavior in response to different operator interactions and within different operating scenarios—system parameters that could be modified to improve performance of the physical machine or system, common operator behaviors that result in substandard machine operation, or other such learned information. Cloud-based troubleshooting systems could also access the snapshot data in connection with troubleshooting a performance issue with the physical machine or process, in order to identify possible solutions or maintenance recommendations for correcting the issue or mitigating future occurrences of the issue.

In another example embodiment, the control and process state information recorded in the snapshot files can be used to train an artificial intelligence system to understand, operate, and/or troubleshoot the physical machine or process represented by the simulation. In such embodiments, the artificial intelligence system can interact with the cloud simulation to simulate operator interactions with the machine or process represented by the simulation. Such interactions can be similar to those carried out by the human trainees via the OTS virtual machines 1204 during a training session. However, in this scenario the artificial intelligence system—rather than the human operator—decides which operator interactions to carry out in response to a given operating scenario presented by the cloud-based OTS system, and observes the simulated machine response to those interactions. In this way, the artificial intelligence system can learn correct operation of a physical machine or process in the same manner as a human user of the OTS system.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 15:
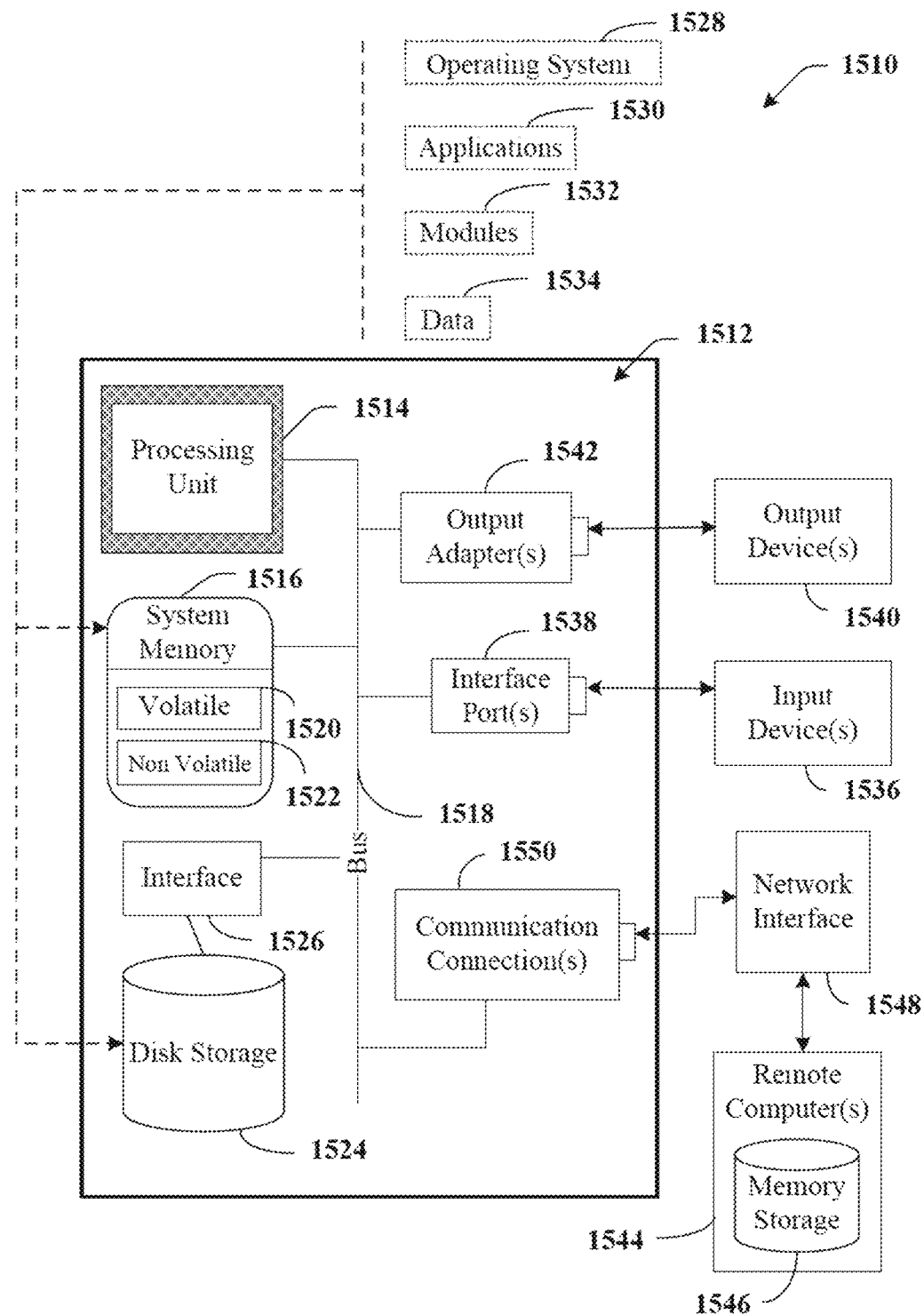
FIG. 15 an example computing environment.
Figure 16:
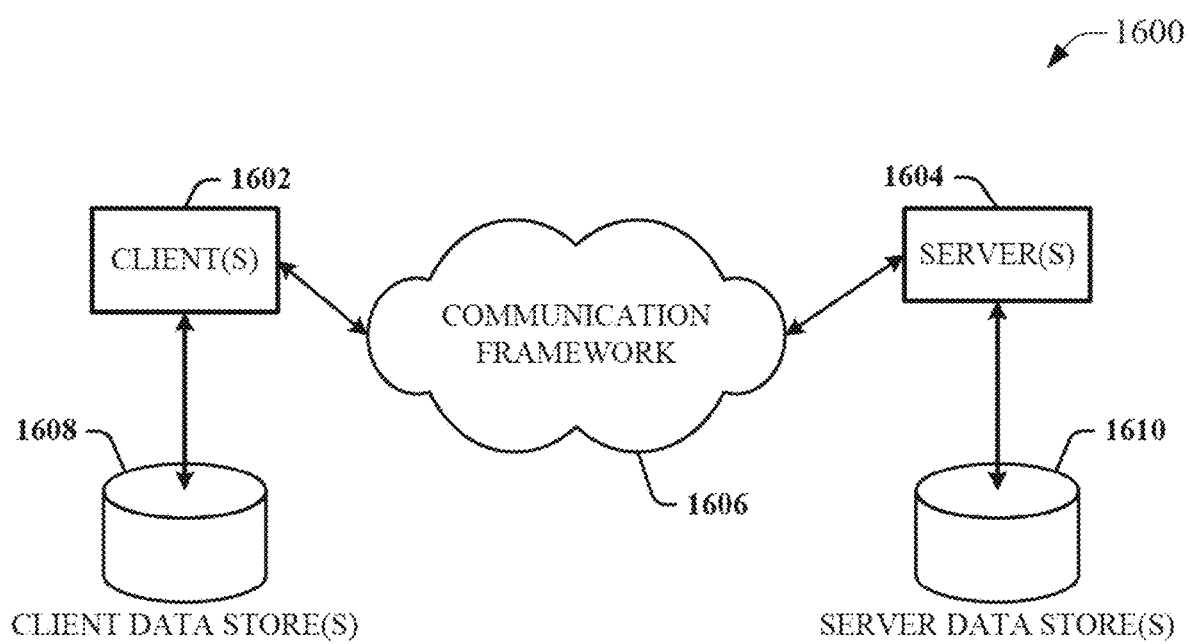
FIG. 16 is an example networking environment

In order to provide a context for the various aspects of the disclosed subject matter, FIGS. 15 and 16 as well as the following discussion are intended to provide a brief, general description of a suitable environment in which the various aspects of the disclosed subject matter may be implemented.

With reference to FIG. 15, an example environment 1510 for implementing various aspects of the aforementioned subject matter includes a computer 1512. The computer 1512 includes a processing unit 1514, a system memory 1516, and a system bus 1518. The system bus 1518 couples system components including, but not limited to, the system memory 1516 to the processing unit 1514. The processing unit 1514 can be any of various available processors. Multi-core microprocessors and other multiprocessor architectures also can be employed as the processing unit 1514.

The system bus 1518 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1516 includes volatile memory 1520 and nonvolatile memory 1522. The basic input/output system (BIOS), containing the basic routines to transfer information between elements within the computer 1512, such as during start-up, is stored in nonvolatile memory 1522. By way of illustration, and not limitation, nonvolatile memory 1522 can include read only memory (ROM), programmable ROM (PROM), electrically programmable ROM (EPROM), electrically erasable PROM (EEPROM), or flash memory. Volatile memory 1520 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchronous Link DRAM (SLDRAM), and direct Rambus RAM (DRRAM).

Computer 1512 also includes removable/non-removable, volatile/non-volatile computer storage media. FIG. 15 illustrates, for example a disk storage 1524. Disk storage 1524 includes, but is not limited to, devices like a magnetic disk drive, floppy disk drive, tape drive, Jaz drive, Zip drive, LS-100 drive, flash memory card, or memory stick. In addition, disk storage 1524 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1524 to the system bus 1518, a removable or non-removable interface is typically used such as interface 1526.

It is to be appreciated that FIG. 15 describes software that acts as an intermediary between users and the basic computer resources described in suitable operating environment 1510. Such software includes an operating system 1528. Operating system 1528, which can be stored on disk storage 1524, acts to control and allocate resources of the computer

1512. System applications 1530 take advantage of the management of resources by operating system 1528 through program modules 1532 and program data 1534 stored either in system memory 1516 or on disk storage 1524. It is to be appreciated that one or more embodiments of the subject disclosure can be implemented with various operating systems or combinations of operating systems.

A user enters commands or information into the computer 1512 through input device(s) 1536. Input devices 1536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1514 through the system bus 1518 via interface port(s) 1538. Interface port(s) 1538 include, for example, a serial port, a parallel port, a game port, and a universal serial bus (USB). Output device(s) 1540 use some of the same type of ports as input device(s) 1536. Thus, for example, a USB port may be used to provide input to computer 1512, and to output information from computer 1512 to an output device(s) 1540. Output adapters 1542 are provided to illustrate that there are some output devices 1540 like monitors, speakers, and printers, among other output devices 1540, which require special adapters. The output adapters 1542 include, by way of illustration and not limitation, video and sound cards that provide a means of connection between the output device 1540 and the system bus 1518. It should be noted that other devices and/or systems of devices provide both input and output capabilities such as remote computer(s) 1544.

Computer 1512 can operate in a networked environment using logical connections to one or more remote computers, such as remote computer(s) 1544. The remote computer(s) 1544 can be a personal computer, a server, a router, a network PC, a workstation, a microprocessor based appliance, a peer device or other common network node and the like, and typically includes many or all of the elements described relative to computer 1512. For purposes of brevity, only a memory storage device 1546 is illustrated with remote computer(s) 1544. Remote computer(s) 1544 is logically connected to computer 1512 through a network interface 1548 and then physically connected via communication connection(s) 1550. Network interface 1548 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1550 refers to the hardware/software employed to connect the network interface 1548 to the system bus 1518. While communication connection(s) 1550 is shown for illustrative clarity inside computer 1512, it can also be external to computer 1512. The hardware/software necessary for connection to the network interface 1548 includes, for exemplary purposes only, internal and external technologies such as, modems including regular telephone grade modems, cable modems and DSL modems, ISDN adapters, and Ethernet cards.

FIG. 16 is a schematic block diagram of a sample computing environment 1600 with which the disclosed subject matter can interact. The sample computing environment 1600 includes one or more client(s) 1602. The client(s) 1602 can be hardware and/or software (e.g., threads, processes, computing devices). The sample computing environment 1600 also includes one or more server(s) 1604. The server(s) 1604 can also be hardware and/or software (e.g., threads, processes, computing devices). The servers 1604 can house threads to perform transformations by employing one or more embodiments as described herein, for example. One possible communication between a client 1602 and servers 1604 can be in the form of a data packet adapted to be transmitted between two or more computer processes. The sample computing environment 1600 includes a communication framework 1606 that can be employed to facilitate communications between the client(s) 1602 and the server(s) 1604. The client(s) 1602 are operably connected to one or more client data store(s) 1608 that can be employed to store information local to the client(s) 1602. Similarly, the server(s) 1604 are operably connected to one or more server data store(s) 1610 that can be employed to store information local to the servers 1604.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy

The invention claimed is:

1. A system, comprising:
a memory that stores executable operations; and
a processor, operatively coupled to the memory, that executes the executable operations, the executable operations comprising:
executing a virtualized industrial controller on a cloud platform;
executing a simulation of one or more devices or processes of an industrial system on the cloud platform to generate a simulated industrial system;
executing an emulation data exchange interface that communicatively connects the virtualized industrial controller and the simulated industrial system, wherein the simulated industrial system is controlled by the virtualized industrial controller through the emulation data exchange interface;
determining whether one or more defined conditions of the simulation have been met; and
in response to determining that the one or more defined conditions of the simulation have been met,
capturing process state data representing one or more states of the simulated industrial system associated with a time of the one or more defined conditions being met and control state data representing input/output values of the virtualized industrial controller from/to the simulated industrial system associated with the time of the one or more defined conditions being met, and
generating simulation files to include the process state data and the control state data.

2. The system of claim 1, wherein the one or more defined conditions comprise simultaneous conditions of the one or more devices or processes of the industrial system.

3. The system of claim 1, wherein the one or more defined conditions comprise a condition in which a temperature represented by the simulation falls below a temperature threshold value.

4. The system of claim 1, wherein the one or more defined conditions comprise a condition in which a pressure represented by the simulation reaches a pressure threshold value.

5. The system of claim 1, wherein the process state data records a simulated status of a simulated industrial device at a time that one of the one or more defined conditions of the simulation was met.

6. The system of claim 1, wherein the control state data represents a state of a control program being executed by the virtualized industrial controller at a time that one of the one or more defined conditions of the simulation was met.

7. The system of claim 1, wherein the executable operations further comprise: capturing new process state data representing a new process state of the simulation and new control state data representing a new control state of the virtualized industrial controller based on an operator input and a response of the simulated industrial system to the operator input, wherein the operator input represents an operator interaction with the simulated industrial system.

8. The system of claim 1, wherein the executable operations further comprise: modeling behaviors of the simulated industrial system under different operating conditions or in response to different operator interactions using the simulation files.

9. A method for industrial simulation, comprising:
executing, by one or more cloud platform devices comprising at least one processor, a virtualized industrial controller on a cloud platform;
executing, by the one or more cloud platform devices, a simulation of one or more devices or processes of an industrial system on the cloud platform to generate a simulated industrial system;
executing, by the one or more cloud platform devices, an emulation data exchange interface that communicatively connects the virtualized industrial controller and the simulated industrial system, wherein the simulated industrial system is controlled by the virtualized industrial controller through the emulation data exchange interface;
determining, by the one or more cloud platform devices, whether one or more defined conditions of the simulation have been met; and
in response to determining that the one or more defined conditions of the simulation have been met,
capturing, by the one or more cloud platform devices, process state data representing one or more states of the simulated industrial system associated with a time of the one or more defined conditions being met and control state data representing input/output values of the virtualized industrial controller from/to the simulated industrial system associated with the time of the one or more defined conditions being met, and
generating, by the one or more cloud platform devices, simulation files to include the process state data and the control state data.

10. The method of claim 9, wherein the one or more defined conditions comprise simultaneous conditions of the one or more devices or processes of the industrial system.

11. The method of claim 9, wherein the one or more defined conditions comprise a condition in which a temperature represented by the simulation falls below a temperature threshold value.

12. The method of claim 9, wherein the one or more defined conditions comprise a condition in which a pressure represented by the simulation reaches a pressure threshold value.

13. The method of claim 9, wherein the process state data records a simulated status of a simulated industrial device at a time that one of the one or more defined conditions of the simulation was met.

14. The method of claim 9, wherein the control state data represents a state of a control program being executed by the virtualized industrial controller at a time that one of the one or more defined conditions of the simulation was met.

15. The method of claim 9, further comprising: capturing, by the one or more cloud platform devices, new process state data representing a new process state of the simulation and new control state data representing a new control state of the virtualized industrial controller based on an operator input and a response of the simulated industrial system to the operator input, wherein the operator input represents an operator interaction with the simulated industrial system.

16. The method of claim 9, further comprising: modeling, by the one or more cloud platform devices, behaviors of the simulated industrial system under different operating conditions or in response to different operator interactions using the simulation files.

17. A non-transitory computer-readable medium having stored thereon executable instructions that, in response to execution, cause a system comprising a processor to perform operations, the operations comprising:

executing a virtualized industrial controller on a cloud platform;

executing a simulation of one or more devices or processes of an industrial system on the cloud platform to generate a simulated industrial system;

executing an emulation data exchange interface that communicatively connects the virtualized industrial controller and the simulated industrial system, wherein the simulated industrial system is controlled by the virtualized industrial controller through the emulation data exchange interface;

determining whether one or more defined conditions of the simulation have been met; and in response to determining that the one or more defined conditions of the simulation have been met, capturing process state data representing one or more states of the simulated industrial system associated with a time of the one or more defined conditions being met and control state data representing input/output values of the virtualized industrial controller from/to the simulated industrial system associated with the time of the one or more defined conditions being met, and generating simulation files to include the process state data and the control state data.

18. The non-transitory computer-readable medium of claim 17, wherein the one or more defined conditions comprise simultaneous conditions of the one or more devices or processes of the industrial system.

19. The non-transitory computer-readable medium of claim 17, wherein the one or more defined conditions comprise a condition in which a temperature represented by the simulation falls below a temperature threshold value.

20. The non-transitory computer-readable medium of claim 17, wherein the one or more defined conditions comprise a condition in which a pressure represented by the simulation reaches a pressure threshold value.

* * * * *